US011579184B2

(12) United States Patent
Shimase et al.

(10) Patent No.: US 11,579,184 B2
(45) Date of Patent: Feb. 14, 2023

(54) ANALYSIS METHOD, ANALYSIS DEVICE, ANALYSIS PROGRAM, AND RECORDING MEDIUM FOR RECORDING ANALYSIS PROGRAM

(71) Applicant: HAMAMATSU PHOTONICS K.K., Hamamatsu (JP)

(72) Inventors: Akira Shimase, Hamamatsu (JP); Kazuhiro Hotta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 136 days.

(21) Appl. No.: 16/766,095

(22) PCT Filed: Sep. 5, 2018

(86) PCT No.: PCT/JP2018/032874
§ 371 (c)(1),
(2) Date: May 21, 2020

(87) PCT Pub. No.: WO2019/102682
PCT Pub. Date: May 31, 2019

(65) Prior Publication Data
US 2021/0373071 A1 Dec. 2, 2021

(30) Foreign Application Priority Data

Nov. 27, 2017 (JP) .............................. JP2017-226569

(51) Int. Cl.
G01R 31/26 (2020.01)
G01R 31/28 (2006.01)
(Continued)

(52) U.S. Cl.
CPC ......... G01R 31/2831 (2013.01); G01R 1/071 (2013.01); G01R 31/2601 (2013.01); G01R 31/2656 (2013.01); G01R 31/308 (2013.01)

(58) Field of Classification Search
CPC ................ G01R 31/2831; G01R 1/071; G01R 31/2601; G01R 31/2656; G01R 31/308
(Continued)

(56) References Cited

U.S. PATENT DOCUMENTS

2002/0093350 A1* 7/2002 Yamada ............... G01R 31/307
324/754.22
2010/0231253 A1* 9/2010 Kitagawa ............. G01R 31/311
324/754.23
(Continued)

FOREIGN PATENT DOCUMENTS

CN 1299465 A 6/2001
CN 1333466 A 1/2002
(Continued)

OTHER PUBLICATIONS

English translation of Junpei "JP2017072542 A Light Emission Analyzer and Failure Location Determination Method" (Year: 2017).*
(Continued)

Primary Examiner — Jermele M Hollington
Assistant Examiner — Courtney G McDonnough
(74) Attorney, Agent, or Firm — Faegre Drinker Biddle & Reath LLP

(57) ABSTRACT

An inspection apparatus includes a light sensor that detects light from a semiconductor device to which an electric signal has been input, an optical system that guides light from the semiconductor device to the light sensor, and a control device electrically connected to the light sensor. The control device includes a measurement unit that acquires waveform data obtained by optical measurement for each of a plurality of positions on a defective semiconductor device and waveform data obtained by the optical measurement for each of a plurality of positions on a non-defective semiconductor device, a calculation unit that calculates a degree of (Continued)

correspondence between the waveform data of the defective semiconductor device and the waveform data of the non-defective semiconductor device, and an analysis unit that analyzes a defective part of the defective semiconductor device on the basis of the degree of correspondence for each of the plurality of positions.

15 Claims, 31 Drawing Sheets

(51) Int. Cl.
  *G01R 1/07* (2006.01)
  *G01R 31/265* (2006.01)
  *G01R 31/308* (2006.01)

(58) Field of Classification Search
  USPC .................................................. 324/754.23
  See application file for complete search history.

(56) References Cited

U.S. PATENT DOCUMENTS

| | | |
|---|---|---|
| 2012/0046778 A1 | 2/2012 | Shioyama |
| 2014/0067319 A1 | 3/2014 | Ogura |
| 2015/0076354 A1* | 3/2015 | Koizumi ................ G01N 33/48 250/341.8 |
| 2015/0199583 A1 | 7/2015 | Nagatomo et al. |
| 2016/0131703 A1* | 5/2016 | Kasapi ................ G01R 31/308 324/754.23 |

FOREIGN PATENT DOCUMENTS

| | | |
|---|---|---|
| CN | 1496478 A | 5/2004 |
| CN | 101490538 A | 7/2009 |
| CN | 103018265 A | 4/2013 |
| CN | 103645197 A | 3/2014 |
| CN | 104201130 A | 12/2014 |
| EP | 2439549 A2 | 4/2012 |
| JP | H10-150086 A | 6/1998 |
| JP | H11-094907 A | 4/1999 |
| JP | H11-304718 A | 11/1999 |
| JP | 2000-304827 A | 11/2000 |
| JP | 2002-156418 A | 5/2002 |
| JP | 2004-045132 A | 2/2004 |
| JP | 2007-064975 A | 3/2007 |
| JP | 2007-157294 A | 6/2007 |
| JP | 2013-041548 A | 2/2013 |
| JP | 2017-072542 A | 4/2017 |
| TW | 201643450 A | 12/2016 |
| WO | WO-2007/013170 A1 | 2/2007 |
| WO | WO 2015/098343 A1 | 7/2015 |

OTHER PUBLICATIONS

International Preliminary Report on Patentability dated Jun. 11, 2020 for PCT/JP2018/032874.

* cited by examiner

Fig. 5
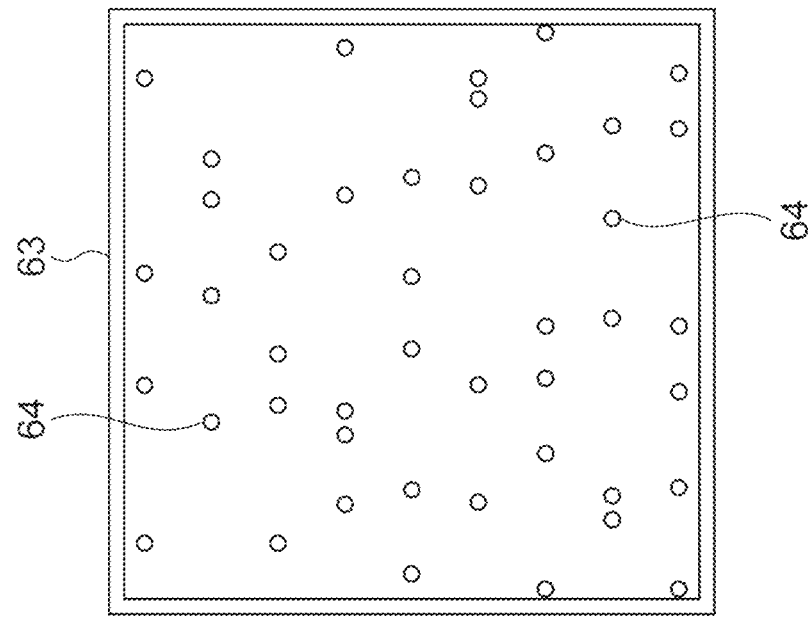
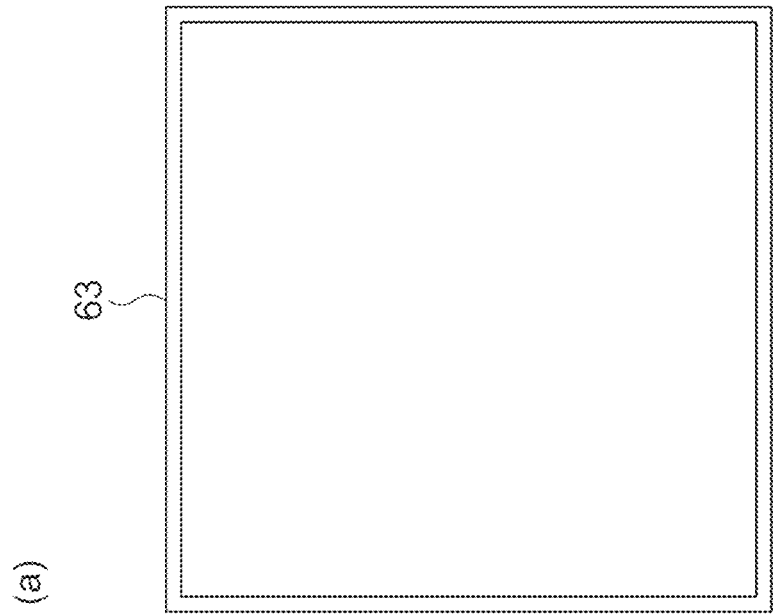

Fig.19
(a)
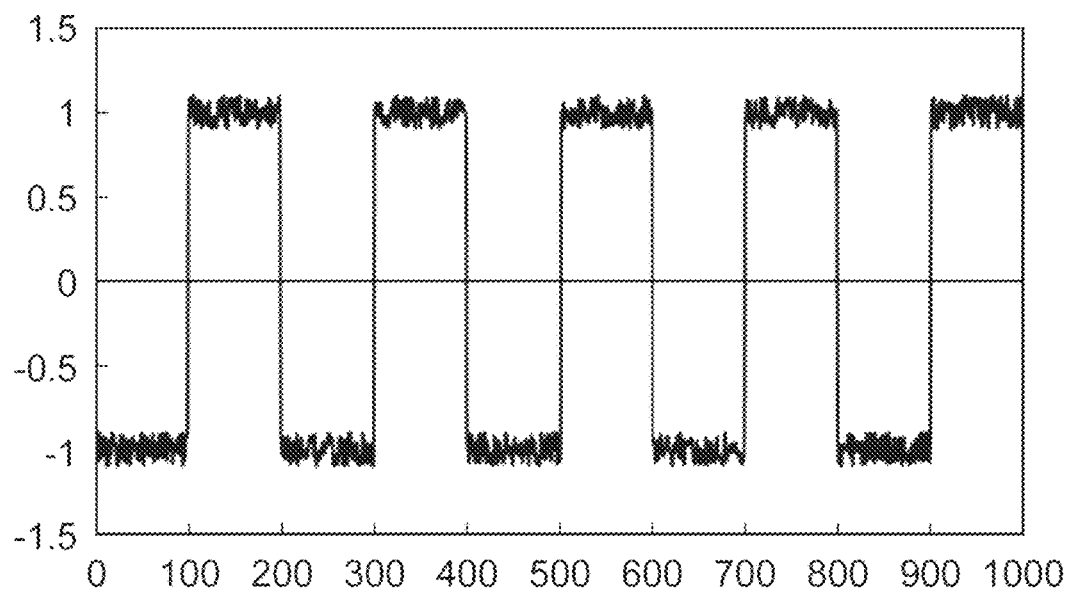
(b)
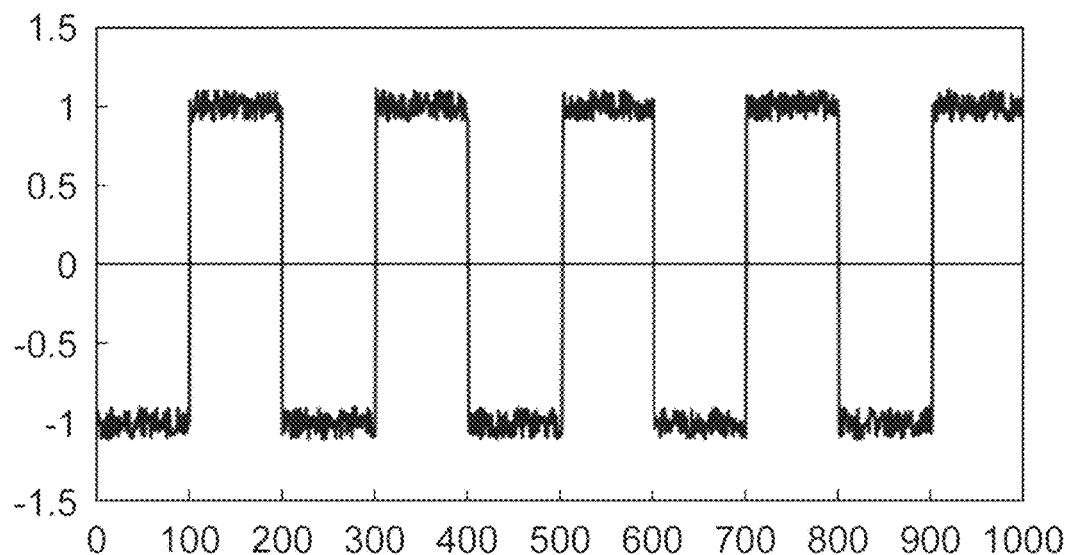

*Fig.20*
(a)
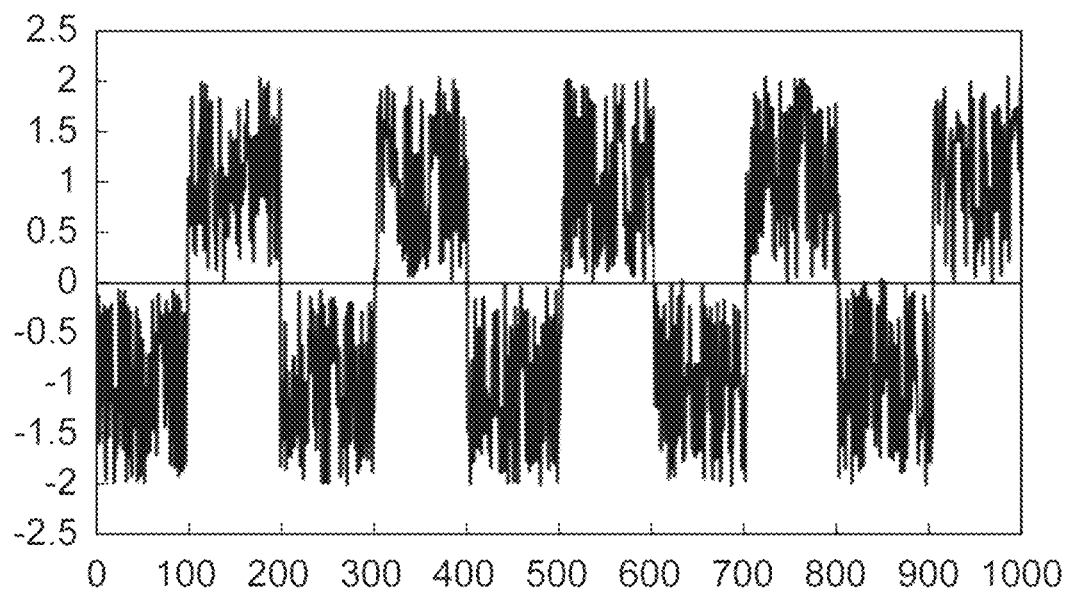
(b)
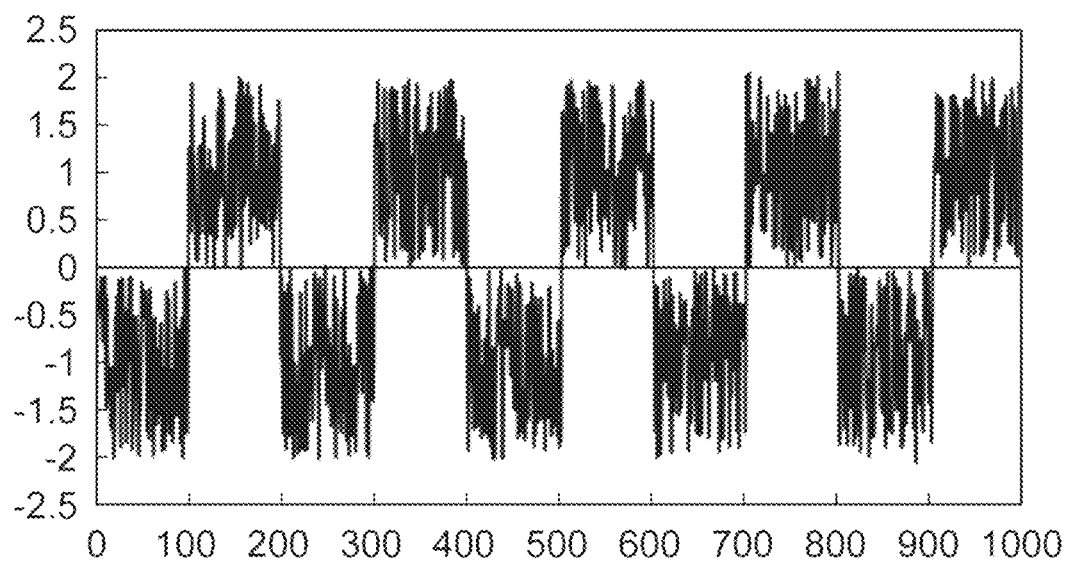

*Fig.21*
(a)
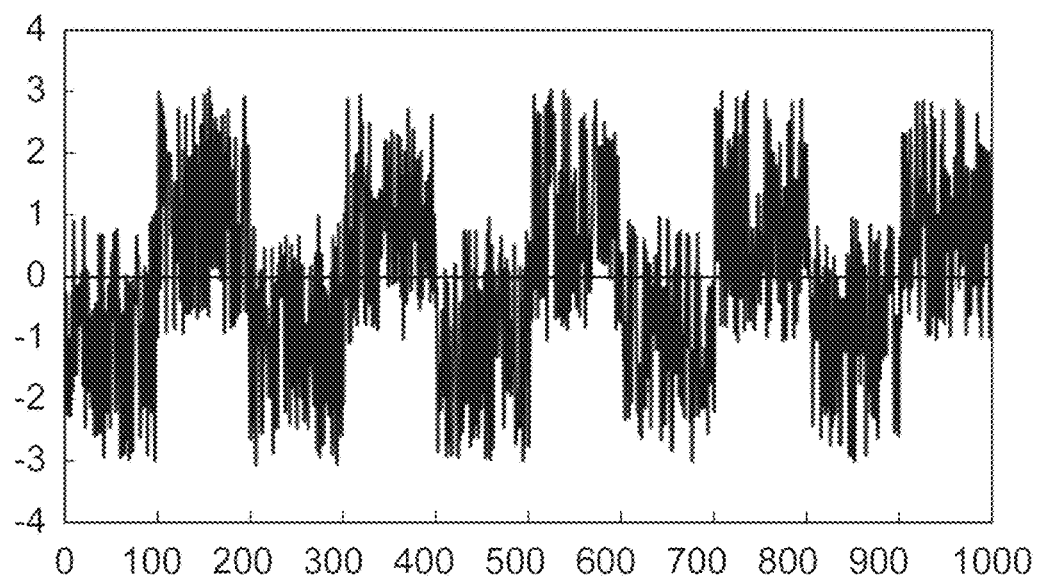
(b)
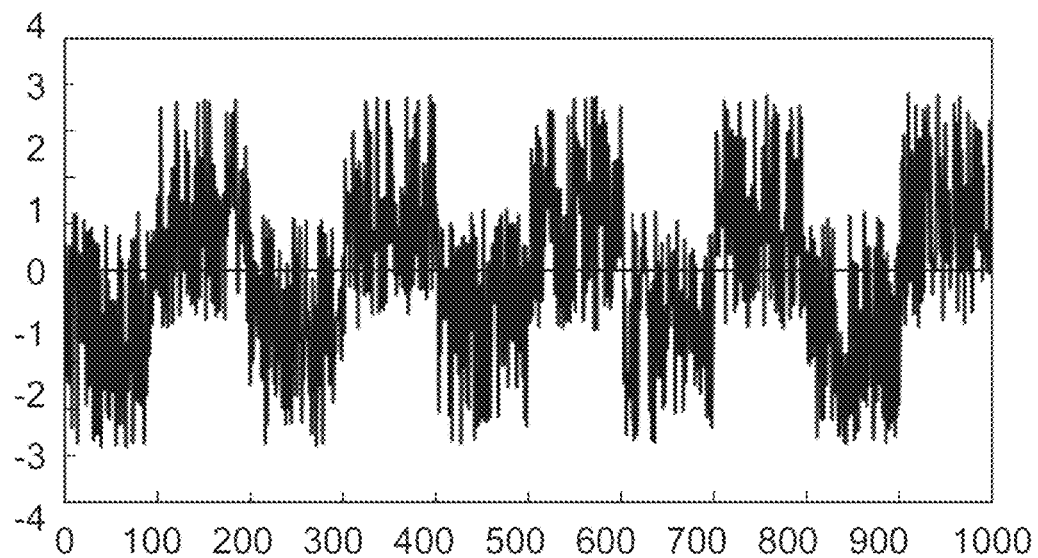

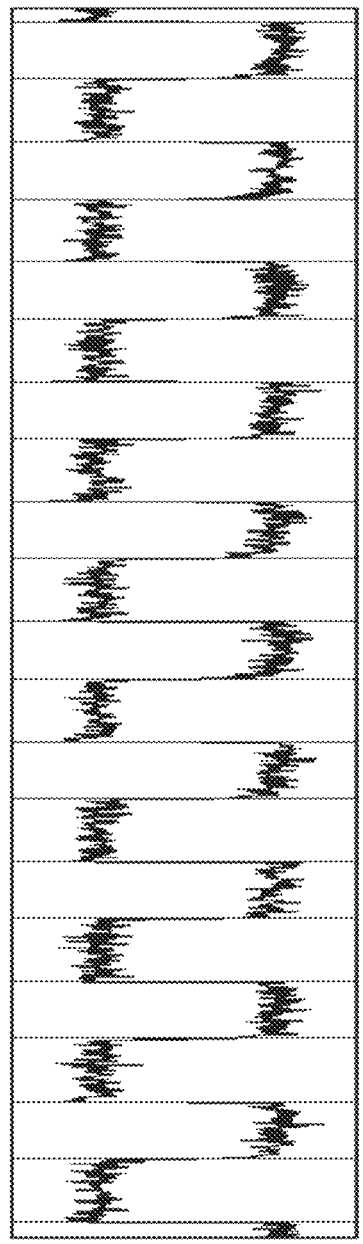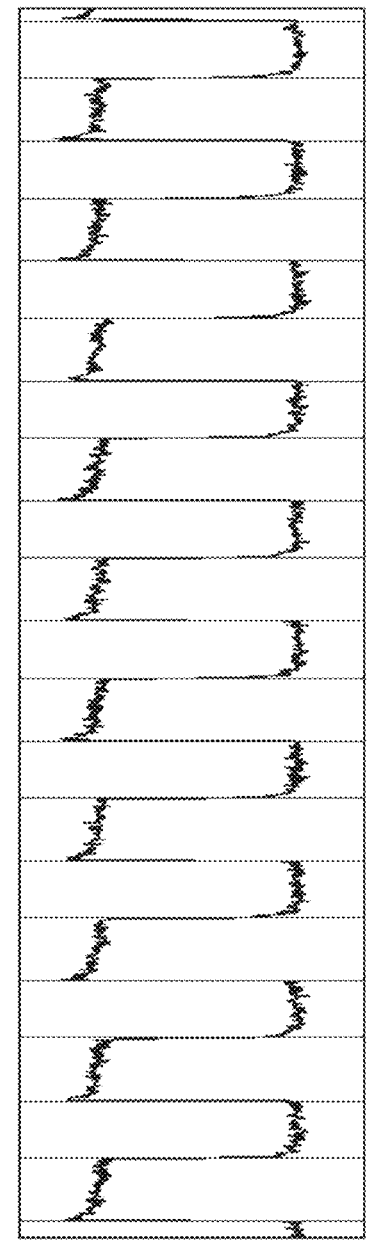
Fig. 26

Fig.30
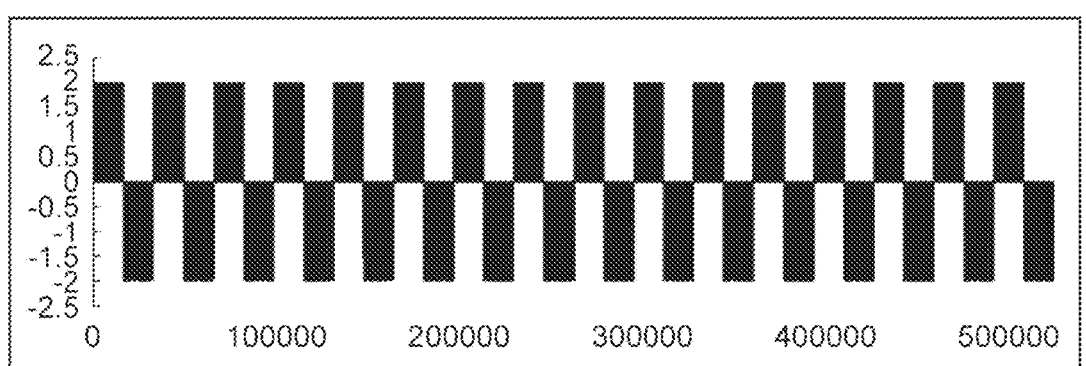
(a)
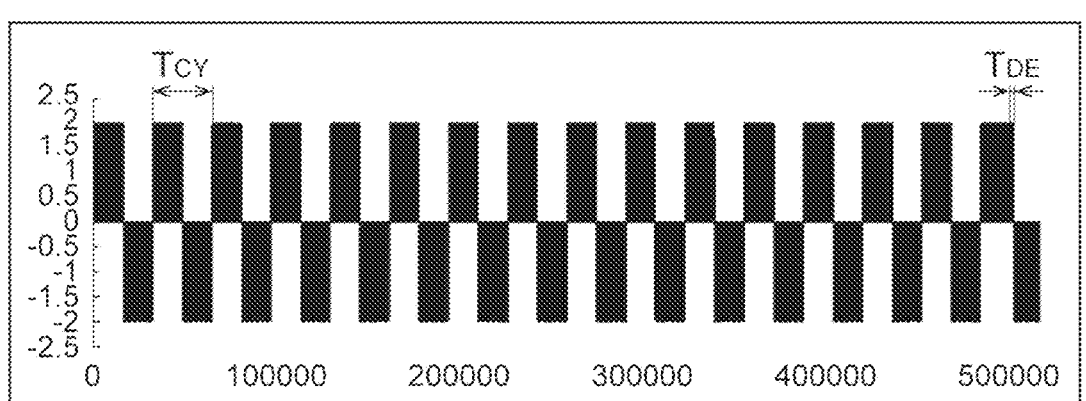
(b)
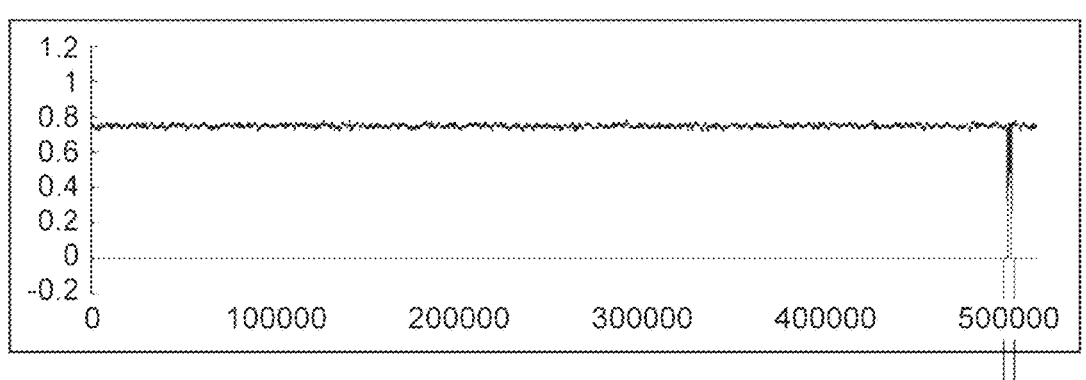
(c)
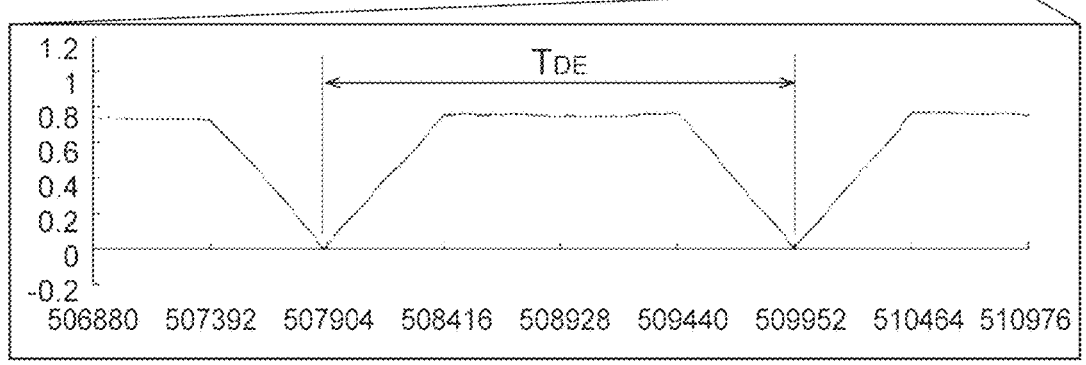
(d)

Fig.31
(a)
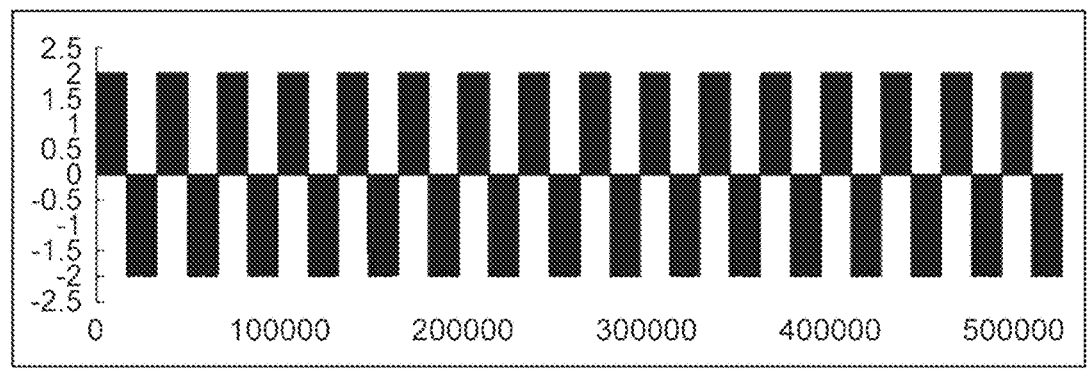
(b)
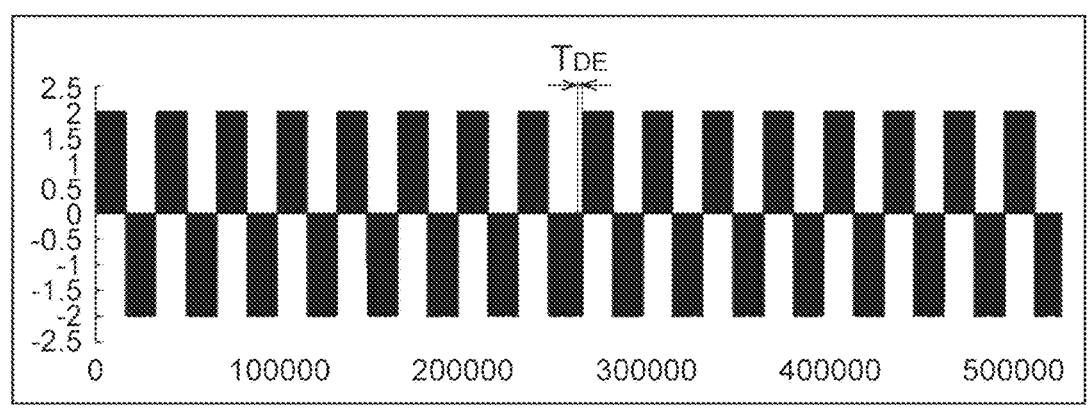
(c)
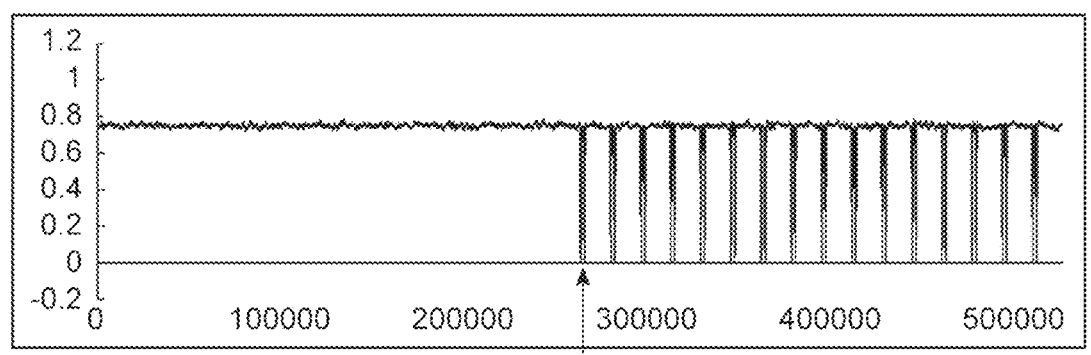

ANALYSIS METHOD, ANALYSIS DEVICE, ANALYSIS PROGRAM, AND RECORDING MEDIUM FOR RECORDING ANALYSIS PROGRAM

TECHNICAL FIELD

The present disclosure relates to an analysis method, an analysis apparatus, an analysis program, and a recording medium having the analysis program recorded thereon which can perform an analysis process using optical measurement for a semiconductor device.

BACKGROUND ART

In the related art, an optical probing technique (see the following Patent Literature 1) called electro-optical probing (EOP) or a time-resolved emission measurement technique (see the following Patent Literature 2) called time-resolved imaging emission microscopy (TRIEM) has been known as a technique for inspecting a semiconductor integrated circuit. For example, in the EOP, a temporal change in a depletion layer due to the driving of a semiconductor device is acquired by measuring a temporal change in the reflectance of probe light. In addition, in the TRIEM, the generation timing of hot carriers flowing between a source and a drain due to the driving of a semiconductor device is measured from a temporal change in light emission intensity.

CITATION LIST

Patent Literature

Patent Literature 1: Japanese Unexamined Patent Publication No. 2007-064975
Patent Literature 2: Japanese Unexamined Patent Publication No. H10-150086

SUMMARY OF INVENTION

Technical Problem

In the above-mentioned inspection techniques, it is necessary to create data that can be easily analyzed from the measurement results obtained by, for example, EOP or TRIEM in order to specify a defective part of a semiconductor device including many circuit elements. However, in the above-mentioned inspection techniques according to the related art, it is hard to say that an analysis method for effectively specifying a defective part has been established.

An object of an embodiment is to provide an analysis method, an analysis apparatus, an analysis program, and a recording medium having the analysis program recorded thereon which can effectively analyze a defective part of a semiconductor device.

Solution to Problem

According to an aspect of the present invention, there is provided an analysis method for performing an analysis process using optical measurement for a semiconductor device. The analysis method includes: a first measurement step of acquiring first waveform data which is a time waveform obtained by optical measurement for each of a plurality of positions on a first semiconductor device; a second measurement step of acquiring second waveform data which is a time waveform obtained by the optical measurement for each of a plurality of positions on a second semiconductor device; a calculation step of calculating a degree of correspondence between the first waveform data for each of the plurality of positions of the first semiconductor device and the second waveform data for each of the plurality of positions of the second semiconductor device which correspond to the plurality of positions; and an analysis step of analyzing a defective part of the first or second semiconductor device on the basis of the degree of correspondence for each of the plurality of positions calculated in the calculation step.

Alternatively, according to another aspect of the present invention, there is provided an analysis apparatus that performs an analysis process using optical measurement for a semiconductor device. The analysis apparatus includes: a light detector configured to detect light from the semiconductor device to which a test signal has been input; an optical system for guiding the light from the semiconductor device to the light detector; and a control device being electrically connected to the light detector. The control device includes: an acquisition means for acquiring first waveform data which is a time waveform obtained by the optical measurement for each of a plurality of positions on a first semiconductor device and second waveform data which is a time waveform obtained by the optical measurement for each of a plurality of positions on a second semiconductor device; a calculation means for calculating a degree of correspondence between the first waveform data for each of the plurality of positions of the first semiconductor device and the second waveform data for each of the plurality of positions of the second semiconductor device which correspond to the plurality of positions; and an analysis means for analyzing a defective part of the first or second semiconductor device on the basis of the degree of correspondence for each of the plurality of positions calculated by the calculation means.

Alternatively, according to still another aspect of the present invention, there is provided an analysis program that causes a computer to function as: an acquisition means for acquiring first waveform data which is a time waveform obtained by optical measurement for each of a plurality of positions on a first semiconductor device and second waveform data which is a time waveform obtained by the optical measurement for each of a plurality of positions on a second semiconductor device; a calculation means for calculating a degree of correspondence between the first waveform data for each of the plurality of positions of the first semiconductor device and the second waveform data for each of the plurality of positions of the second semiconductor device which correspond to the plurality of positions; and an analysis means for analyzing a defective part of the first or second semiconductor device on the basis of the degree of correspondence for each of the plurality of positions calculated by the calculation means.

Alternatively, according to still another aspect of the present invention, there is provided a computer-readable recording medium having the analysis program recorded thereon.

According to any one of the above-mentioned aspects, the degree of correspondence between the waveform data items which are the optical measurement results at a plurality of corresponding positions of the first semiconductor device and the second semiconductor device is calculated and a defective part of the first or second semiconductor device is analyzed on the basis of the degree of correspondence. Therefore, the defective part can be analyzed on the basis of the distribution of the degree of correspondence between the time waveforms on the semiconductor devices. As a result, it is possible to effectively analyze a defective part.

Advantageous Effects of Invention

According to the embodiments, it is possible to effectively analyze a defective part of a semiconductor device.

BRIEF DESCRIPTION OF DRAWINGS

FIG. 5 is a diagram illustrating an image of optical measurement positions set in a measurement coordinate system by the setting unit 24 illustrated in FIG. 2.

FIG. 19 is a diagram illustrating time waveforms indicated by two waveform data items whose degree of correspondence is to be calculated.

FIG. 20 is a diagram illustrating time waveforms indicated by two waveform data items whose degree of correspondence is to be calculated.

FIG. 21 is a diagram illustrating time waveforms indicated by two waveform data items whose degree of correspondence is to be calculated.

FIG. 26 is a diagram illustrating time waveforms indicated by waveform data items whose degree of correspondence is to be calculated.

FIG. 30 is a diagram illustrating time waveforms indicated by waveform data items whose degree of movement correspondence is to be calculated and a temporal change in the calculated degree of movement correspondence.

FIG. 31 is a diagram illustrating time waveforms indicated by waveform data items whose degree of movement correspondence is to be calculated and a temporal change in the calculated degree of movement correspondence.

DESCRIPTION OF EMBODIMENTS

Figure 1:
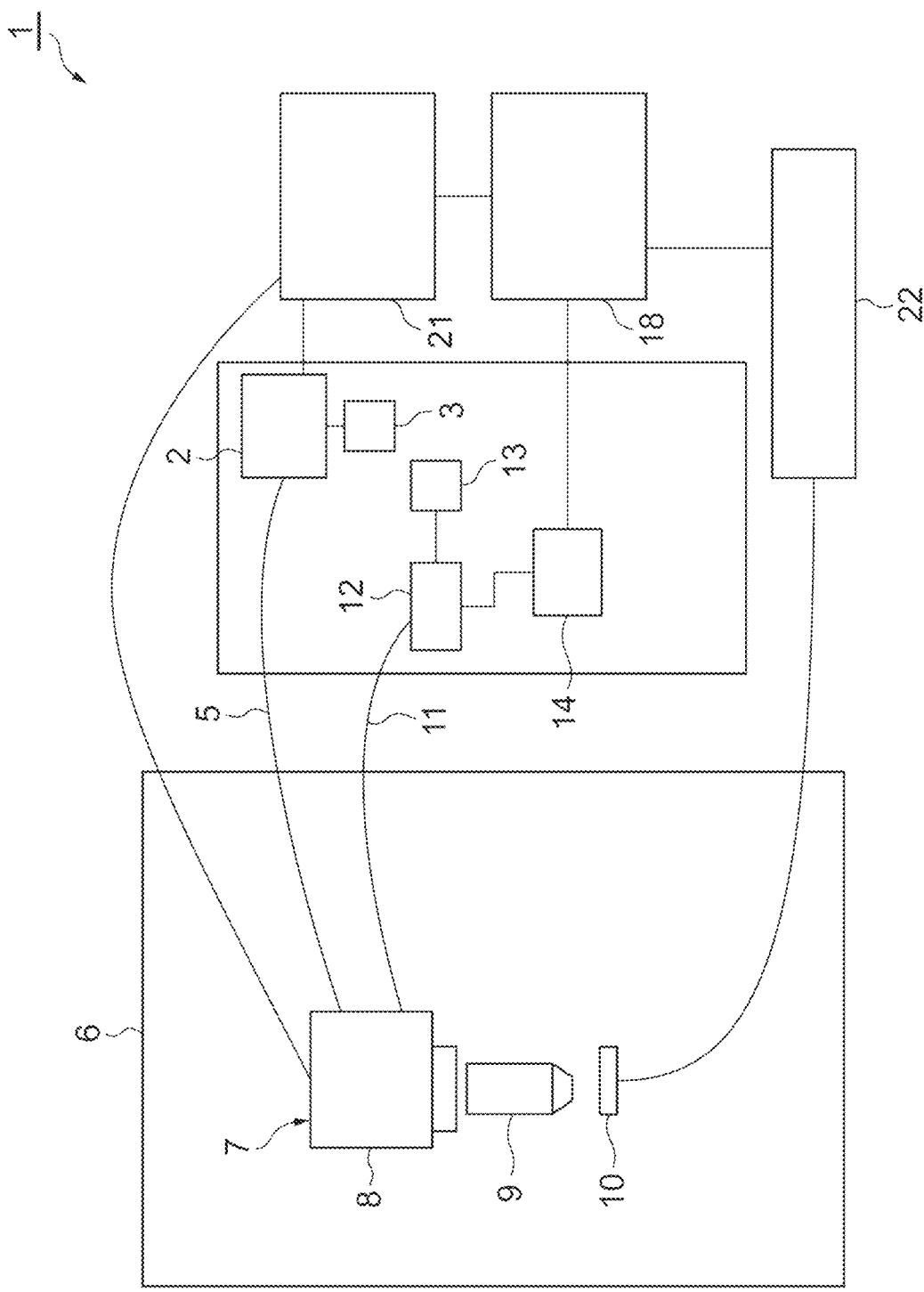
FIG. 1 is a block diagram schematically illustrating the configuration of a semiconductor device inspection apparatus 1 which is an analysis apparatus according to an embodiment.

Hereinafter, embodiments of the present invention will be described in detail with reference to the accompanying drawings. Incidentally, in the following description, the same elements or elements having the same function are denoted by the same reference numerals and the description thereof will not be repeated.

FIG. 1 is a block diagram schematically illustrating the configuration of a semiconductor device inspection apparatus 1 which is an analysis apparatus according to an embodiment. As illustrated in FIG. 1, the semiconductor device inspection apparatus 1 is an apparatus that performs optical measurement for a semiconductor device 10 which is a device under test (DUT) as a measurement target to perform analysis such as the specification of a part (defective part) in which a defect occurs in the semiconductor device 10.

Examples of the semiconductor device 10 include individual semiconductor elements (discrete), optoelectronic elements, and sensors/actuators including diodes or power transistors, logic large scale integrations (LSIs), memory elements, linear integrated circuits (ICs), including transistors with a metal-oxide-semiconductor (MOS) structure or a bipolar structure, and hybrid devices thereof. In addition, the semiconductor device 10 may be, for example, a package or a composite substrate including a semiconductor device.

The semiconductor device inspection apparatus 1 includes a light source 2. The light source 2 is an incoherent light source, such as a light emitting diode (LED) light source or a super luminescent diode (SLD) light source, or a coherent light source, such as a laser. The light source 2 is operated by a first power supply 3 and emits light with which the semiconductor device 10 is to be irradiated. The light emitted from the light source 2 is guided to a scanning optical system 7 through an optical fiber 5 for probe light. The scanning optical system (optical scanning unit) 7 includes a scanning head 8 and a lens system 9 and can be operated so as to two-dimensionally scan a desired position on the semiconductor device 10 with the light guided through the optical fiber 5. Incidentally, the scanning optical system 7 and the semiconductor device 10 are provided in a dark box 6.

Light reflected from the semiconductor device 10 when the semiconductor device 10 is irradiated with the light emitted from the light source 2 is guided to a light sensor (light detector) 12 through an optical system including the lens system 9, the scanning head 8, and an optical fiber 11 for return light. The light sensor 12 is operated by a second power supply 13 provided separately from the first power supply 3, detects the reflected light, and outputs a detection signal indicating the intensity level of the reflected light. For example, the light sensor 12 includes a photo-detection element, such as a photomultiplier tube, a photodiode (PD), or an avalanche photodiode (APD). The light sensor 12 is electrically connected to a control device 18 through an amplifier 14 and an amplified detection signal output from the light sensor 12 is input to the control device 18. In addition, the control device 18 is electrically connected to a beam scanning controller 21 and a tester unit 22. The control device 18 acquires waveform data indicating the time waveform of the intensity of the reflected light on the basis of the detection signal that has been acquired continuously in time, performs defect analysis on the basis of the waveform data, and outputs the result of the defect analysis to an output device, such as a display, an external storage medium, or the like.

The beam scanning controller 21 controls the light source 2 and the scanning optical system 7 on the basis of an instruction signal from the control device 18. The tester unit 22 is, for example, a tester or a pulse generator and applies a predetermined electric signal (test signal) to the semiconductor device 10 on the basis of an instruction signal from the control device 18. Then, a plurality of parts (positions) of the semiconductor device 10, to which the electric signal has been applied, are two-dimensionally scanned with the light from the light source 2 and reflected light generated from the plurality of parts by the scanning is detected. In this way, an analysis process is performed for the semiconductor device 10.

Next, the configuration of the control device 18 will be described in detail.

Figure 2:
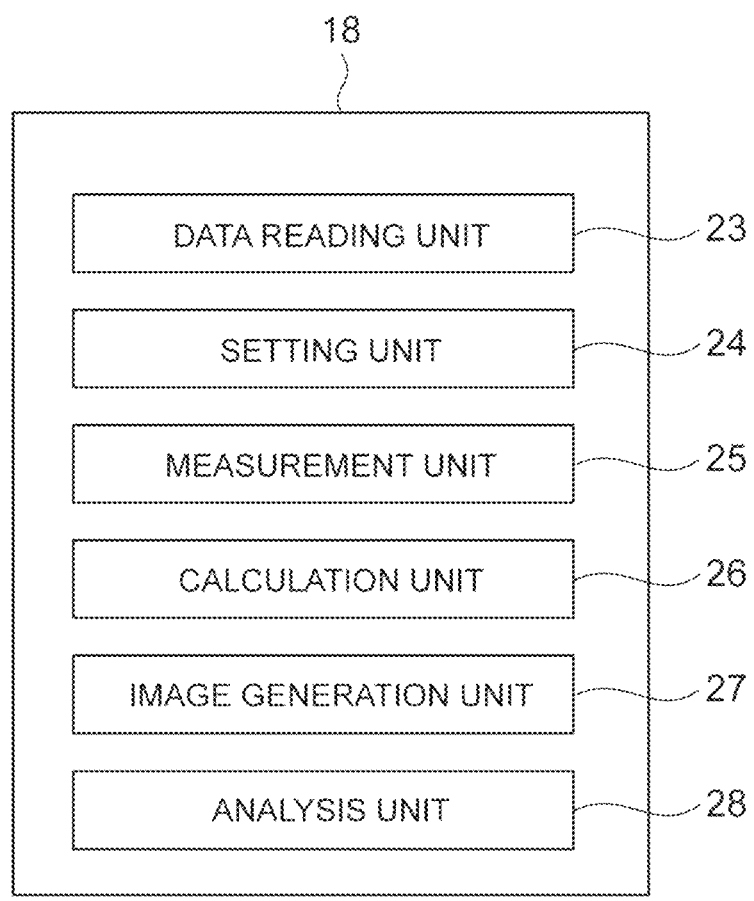
FIG. 2 is a block diagram illustrating the functional configuration of a control device 18 illustrated in FIG. 1.

First, the functional configuration of the control device 18 will be described with reference to FIG. 2. As illustrated in FIG. 2, the control device 18 includes, as functional components, a data reading unit 23, a setting unit 24, a measurement unit (acquisition means) 25, a calculation unit (calculation means) 26, an image generation unit (image generation means) 27, and an analysis unit (analysis means) 28.

Figure 3:
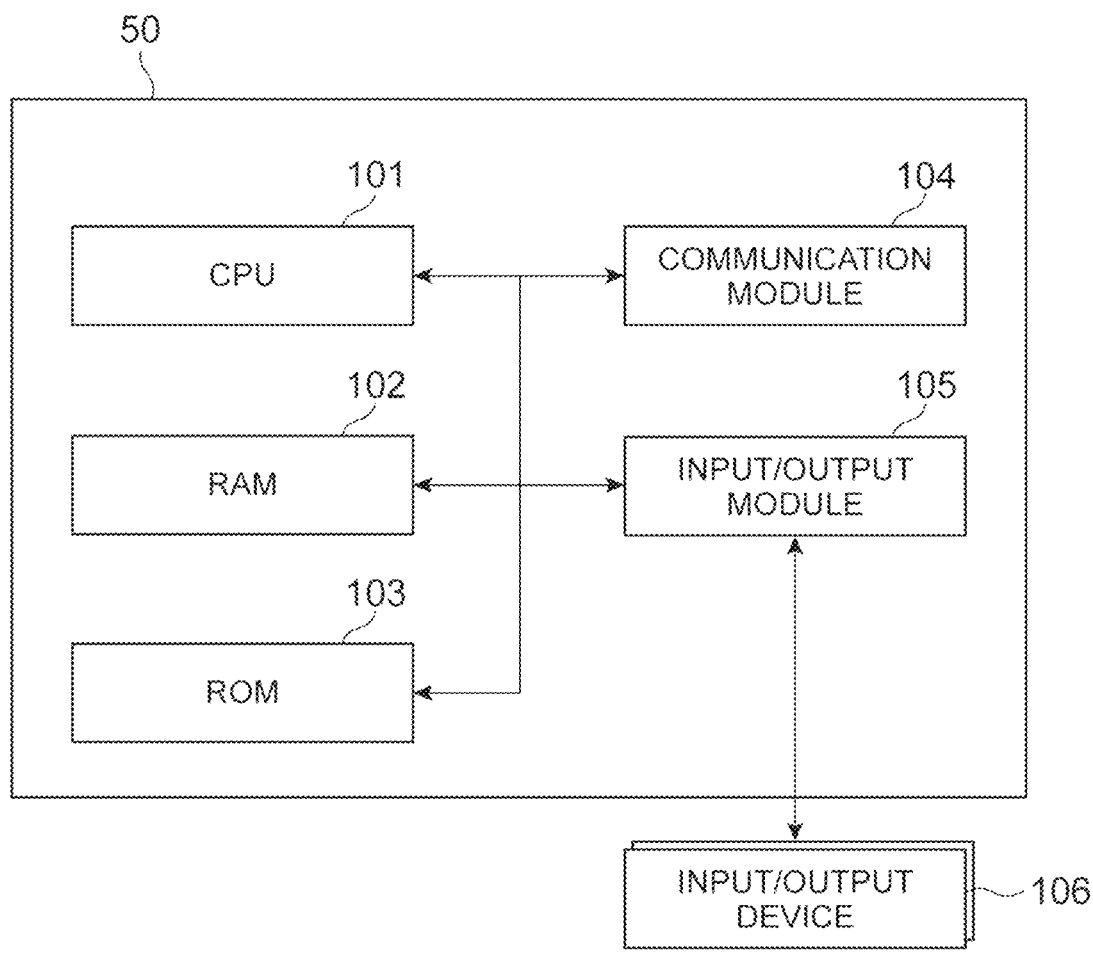
FIG. 3 is a diagram illustrating the hardware configuration of the control device 18 illustrated in FIG. 1.

FIG. 3 is a block diagram illustrating the hardware configuration of the control device 18. As illustrated in FIG. 3, the control device 18 is implemented by an arithmetic device 50 and an input/output device 106, such as a keyboard, a mouse, a display device, a data reading device, or a storage medium drive device, connected to the outside of the arithmetic device 50. For example, the arithmetic device 50 is physically a computer including a central processing unit (CPU) 101 which is a processor, a random access memory (RAM) 102 or a read only memory (ROM) 103 which is a recording medium, a communication module 104, and an input/output module 105 which are electrically connected to each other. Each of the functional units of the control device 18 is implemented by reading the analysis program according to the embodiment onto hardware, such as the CPU 101 and the RAM 102, operating, for example, the communication module 104 and the input/output module 105, and reading and writing data from and to the RAM 102 under the control of the CPU 101.

Next, each of the functional units of the control device 18 will be described in detail.

The data reading unit 23 has a function of reading mask data that is data indicating a mask layout of the semiconductor device 10 as a DUT from the outside. Here, the mask data is generally data indicating the layout (shape and arrangement) of a photomask on a semiconductor substrate which is required when the semiconductor device 10 is manufactured and is data of a stream data format indicating the layout of a mask for each layer of the semiconductor device 10. The mask data is created by an engineer who is a designer when a semiconductor device is designed and is used by an engineer who is a manufacturer when a semiconductor device is manufactured. Examples of the standard format of the mask data include Graphic Data System (GDS (registered trademark)) and Open Artwork System Interchange Standard (OASIS (registered trademark)). The data reading unit 23 may read mask data including the mask layouts of all of the layers of the semiconductor device 10. The data reading unit 23 reads at least mask data including the mask layout of a gate layer of the semiconductor device 10.

The setting unit 24 searches for a plurality of positions of transistors which are suitable for optical measurement for defect analysis or where optical measurement is easily performed in the semiconductor device 10 on the basis of polygon data indicating the mask layout of the gate layer included in the mask data with reference to the mask data read by the data reading unit 23 and sets the plurality of positions as optical measurement target positions.

Figure 4:
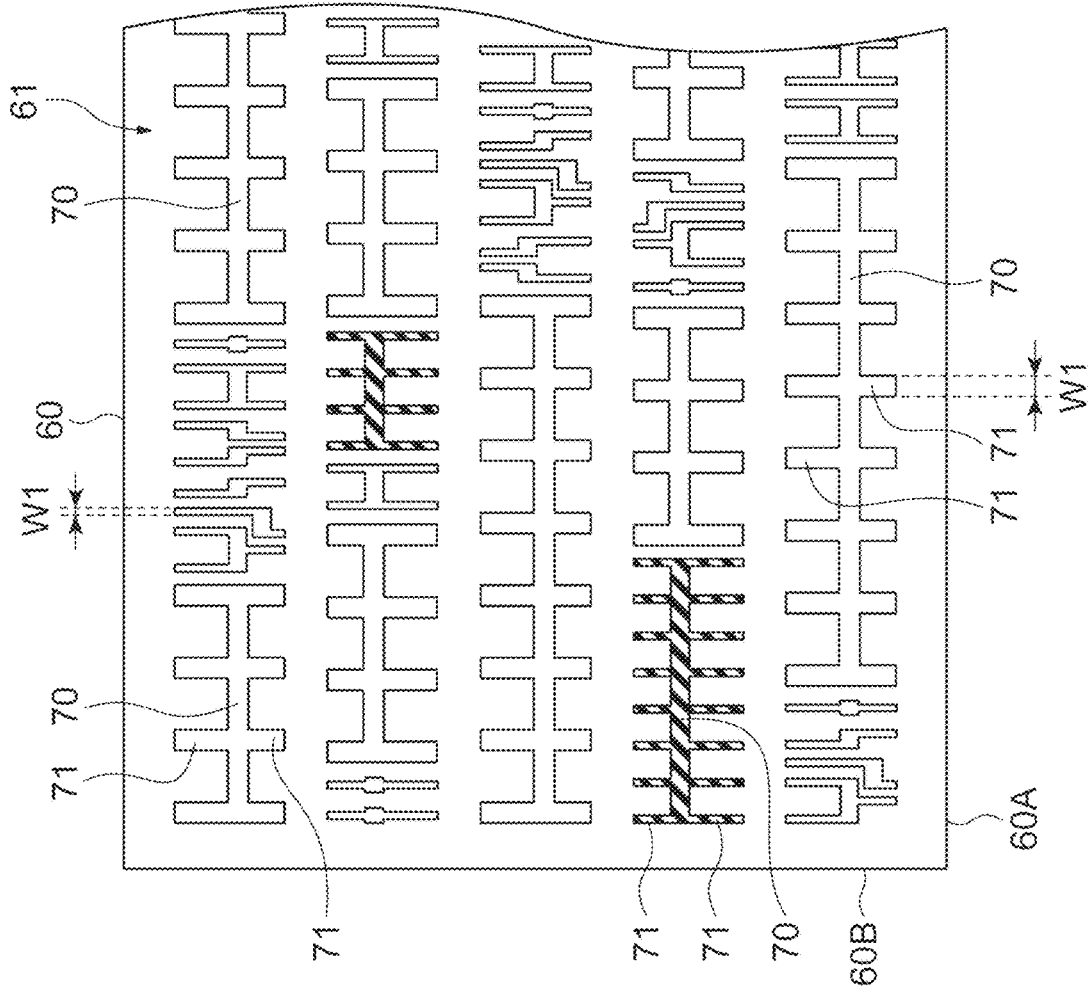
FIG. 4 is a diagram illustrating an image of polygon data included in mask data processed by a setting unit 24 illustrated in FIG. 2.

FIG. 4 is a diagram illustrating an image of the polygon data included in the mask data processed by the setting unit 24. As illustrated in FIG. 4, the polygon data indicates the shape and arrangement of polygonal mask patterns 61 on the gate layer based on an outer edge 60 of a semiconductor substrate on which the semiconductor device 10 is constructed. In general, a plurality of rows of the mask patterns 61 are arranged along a side 60A in one direction of the outer edge 60.

For the polygon data, the setting unit 24 recognizes a strip-shaped pattern 71 that extends from a strip-shaped pattern 70 provided along one direction in two directions along a side 60B which is perpendicular to the one direction in each mask pattern 61 on the gate layer and extracts a mask pattern 61 in which the length W1 of the pattern 71 is equal to or less than a predetermined value. Then, the setting unit 24 specifies the number of patterns 71 extending from the pattern 70 in one of the two directions on the basis of the patterns 70 and 71 of the extracted mask patterns 61. In this case, the setting unit 24 lists the number of the specified patterns 71 for each mask pattern 61 and stores the list in a database of a memory such as the RAM 102 of the control device 18. In addition, the setting unit 24 specifies the total number of patterns 71 extending from the pattern 70 in the two directions with reference to the memory in the stored database and excludes a mask pattern 61 in which the specified total number of patterns is equal to or less than a predetermined threshold. The setting unit 24 performs the extraction process to search for the position of a mask pattern 61 including a gate layer corresponding to the position of a transistor with a relatively high driving capability in a coordinate system (hereinafter, referred to as a substrate coordinate system) based on the semiconductor substrate of the semiconductor device 10. In FIG. 4, the mask pattern 61 finally extracted by the setting unit 24 is hatched.

Further, the setting unit 24 determines, for example, the position of the transistor with a relatively high driving capability from the searched position of the mask pattern 61. For example, the setting unit 24 determines, as the position of the transistor, the coordinates of both ends (for example, a lower right end and an upper left end) or the center of any pattern 70 in the extracted mask pattern 61 in the substrate coordinate system.

In addition, the setting unit 24 sets a plurality of optical measurement positions on the basis of the extracted positions of the plurality of transistors. That is, the setting unit 24 transforms the coordinates of the plurality of transistors in the substrate coordinate system into coordinates in a coordinate system (hereinafter, referred to as a measurement coordinate system) treated by the beam scanning controller 21 and the tester unit 22. This method compares a characteristic pattern of an image in the substrate coordinate system with a corresponding characteristic pattern in the measurement coordinate system and makes the coordinate systems correspond to each other. A transform coefficient for correspondence is calculated by this operation and the coordinates transformed by this coefficient are set as the optical measurement position. Incidentally, the semiconductor device inspection apparatus 1 may be separately provided with an imaging device, such as a CMOS camera or an InGaAs camera, for acquiring a two-dimensional image of the semiconductor device 10 and may dynamically transform the coordinates of the transistor into the coordinates in the measurement coordinate system on the semiconductor device 10 on the basis of the two-dimensional pattern image of the semiconductor device 10 acquired in advance by the imaging device.

FIG. 5 illustrates the image of the optical measurement position set in the measurement coordinate system by the setting unit 24. The setting unit 24 sets the position of a semiconductor substrate 63 of the semiconductor device 10 in the measurement coordinate system (a portion (a) of FIG. 5) and sets a plurality of optical measurement positions 64 on the semiconductor substrate 63 in the measurement coordinate system (a portion (b) of FIG. 5).

Returning to FIG. 2, the measurement unit 25 controls the beam scanning controller 21 on the basis of the optical measurement positions set by the setting unit 24. At the same time, the measurement unit 25 starts the application of an electric signal by the tester unit 22 to perform optical measurement. Specifically, the measurement unit 25 outputs an instruction signal for instructing the optical measurement position to the beam scanning controller 21 such that light is emitted to the optical measurement position in the semiconductor device 10 and a detection signal of reflected light from the position is output. The optical measurement at one position is continued for a predetermined period of time while applying an electric signal to the semiconductor device 10. Further, the measurement unit 25 repeatedly performs the optical measurement for each of the plurality of optical measurement positions set by the setting unit 24. In addition, the measurement unit 25 acquires waveform data indicating the time waveform of the intensity of the reflected light for each optical measurement position on the basis of the detection signal for each optical measurement position obtained by the optical measurement.

Figure 6:
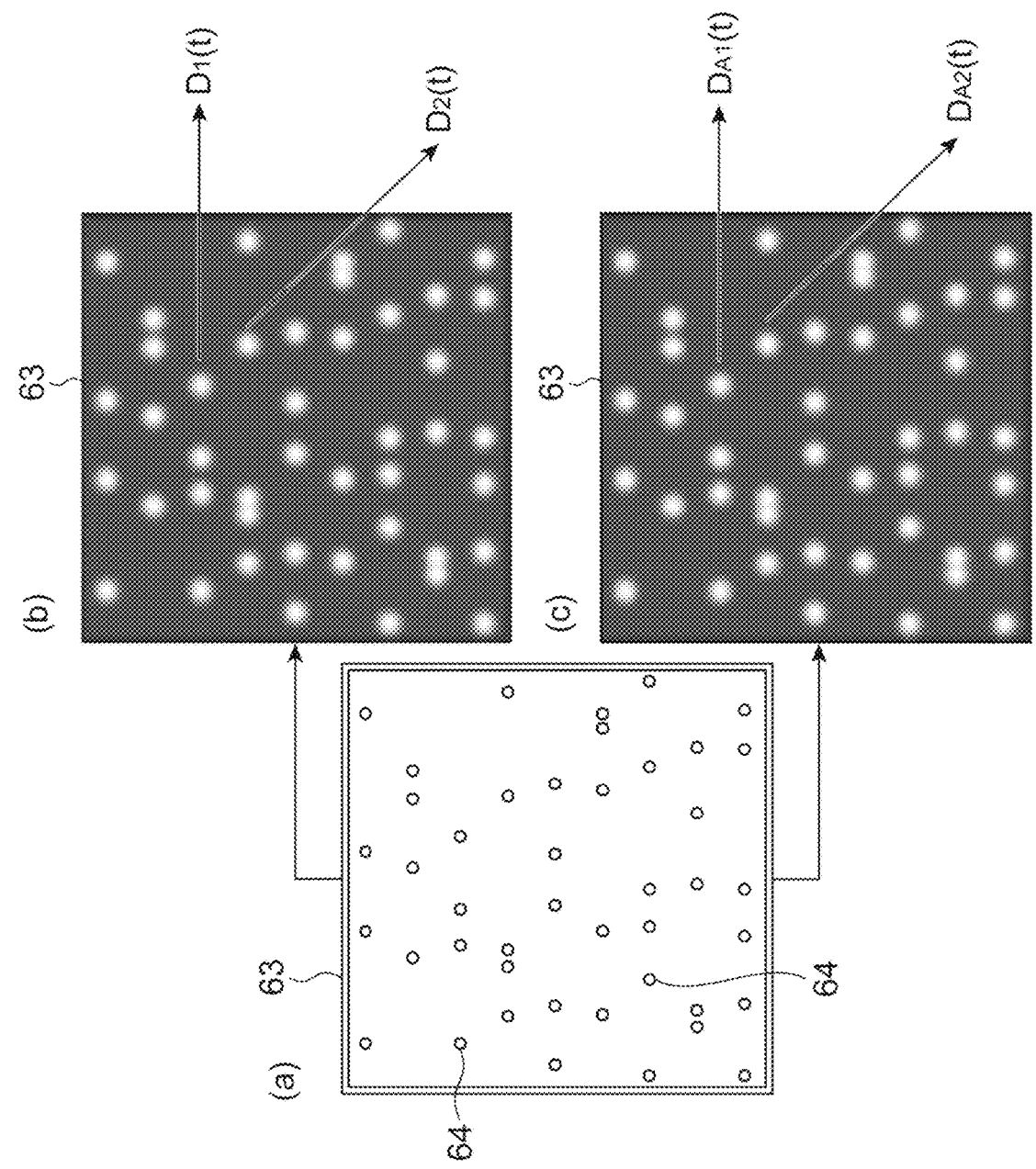
FIG. 6 is a diagram illustrating an image of reflected light detected by a measurement unit 25 illustrated in FIG. 2.

FIG. 6 illustrates an image of the reflected light detected by the measurement unit 25. The measurement unit 25 performs optical measurement for the plurality of optical measurement positions 64 (a portion (a) of FIG. 6) on the semiconductor substrate 63 of the semiconductor device 10 set by the setting unit 24, performs optical measurement for a defective semiconductor device 10 to acquire waveform data items $D_1(t)$ and $D_2(t)$ of the intensity of reflected light corresponding to a plurality of optical measurement positions (a portion (b) of FIG. 6), and performs optical measurement for a non-defective semiconductor device 10 to acquire waveform data items $D_{A1}(t)$ and $D_{A2}(t)$ of the intensity of reflected light corresponding to a plurality of optical measurement positions (a portion (c) of FIG. 6).

Returning to FIG. 2 again, the calculation unit 26 calculates a degree of correspondence between the waveform data items, using the waveform data for each optical measurement position of the defective semiconductor device 10 acquired by the measurement unit 25 and the waveform data for each optical measurement position of the non-defective semiconductor device 10 acquired by the measurement unit 25. That is, the calculation unit 26 calculates a degree of correspondence between changes in the amplitudes of the time waveforms, using the waveform data for one position of the defective semiconductor device 10 and the waveform data for a corresponding position of the non-defective semiconductor device 10. In addition, the calculation unit 26 repeatedly performs the calculation of the degree of correspondence between two waveform data items for a plurality of corresponding positions. The image generation unit 27 maps the degree of correspondence for each of a plurality of positions on the semiconductor device 10 calculated by the calculation unit 26 onto two-dimensional coordinates to generate correspondence degree image data.

Figure 7:
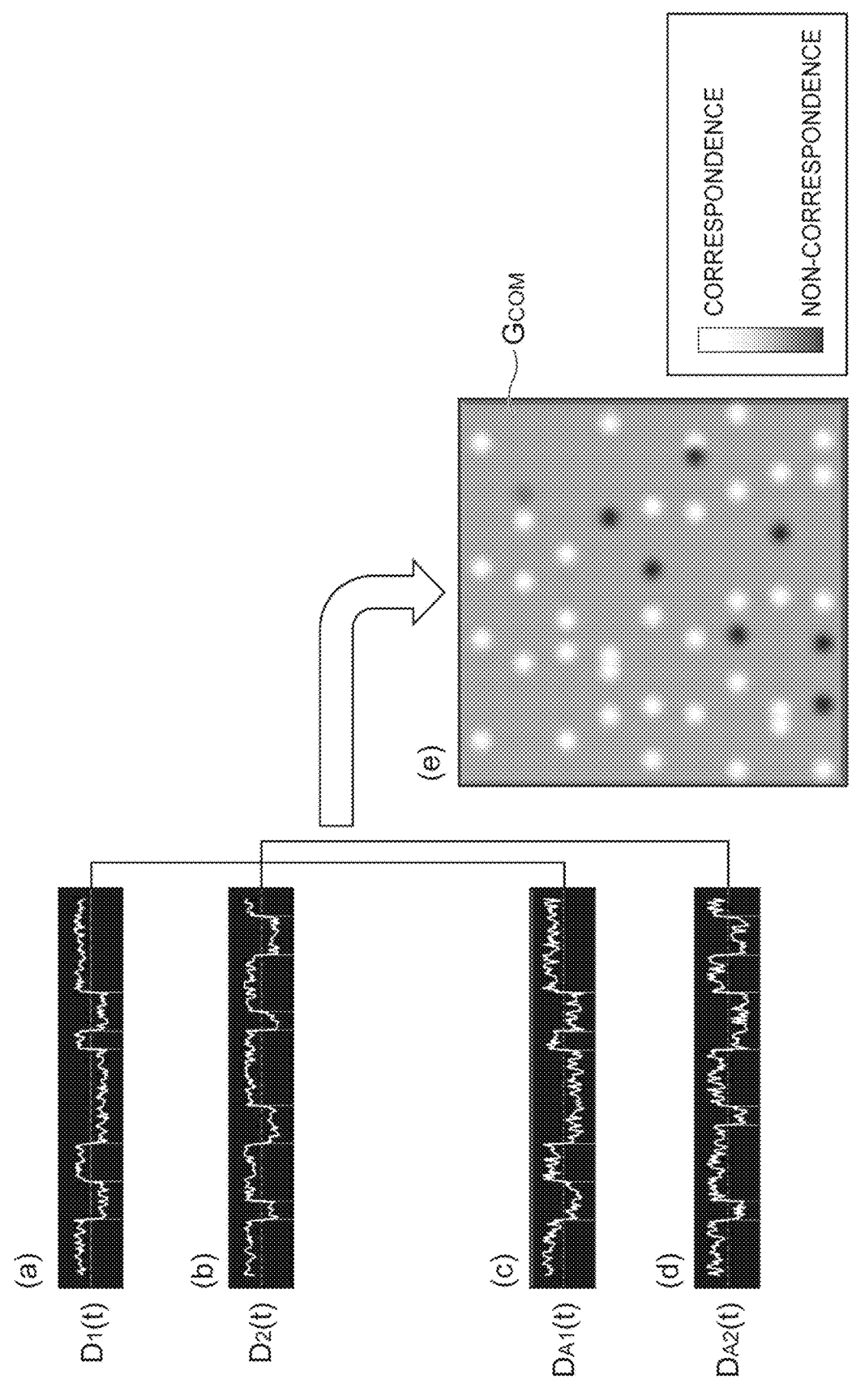
FIG. 7 is a diagram illustrating an image of correspondence degree image data generated by an image generation unit 27 illustrated in FIG. 2.

FIG. 7 illustrates an image of the correspondence degree image data generated by the image generation unit 27. The calculation unit 26 compares data items corresponding to the same optical measurement position in the waveform data items $D_1(t)$ and $D_2(t)$ (a portion (a) and a portion (b) of FIG. 7) of the defective semiconductor device 10 and the waveform data items $D_{A1}(t)$ and $D_{A2}(t)$ (a portion (c) and a portion (d) of FIG. 7) of the non-defective semiconductor device 10 acquired by the measurement unit 25 to calculate the degree of correspondence. In this case, when the correspondence between the optical measurement position in the measurement coordinate system at the time of the optical measurement for the defective semiconductor device 10 and the optical measurement position in the measurement coordinate system at the time of the optical measurement for the non-defective semiconductor device 10 is made, a method (see WO2015/098343A) using coordinate transform information, such as matching information derived on the basis of both images, is applied. In addition, in this case, a procedure used when the coordinates in the substrate coordinate system of the semiconductor device 10 are transformed into coordinates in the measurement coordinate system may be used for the correspondence between the optical measurement position in the measurement coordinate system at the time of the optical measurement for the defective semiconductor device 10 and the optical measurement position in the measurement coordinate system at the time of the optical measurement for the non-defective semiconductor device 10. Further, the image generation unit 27 generates correspondence degree image data $G_{COM}$ (a portion (e) of FIG. 7) in which the degree of correspondence between the waveform data items at each optical measurement position in two-dimensional coordinates on the semiconductor device 10 is represented by shading.

Figure 8:
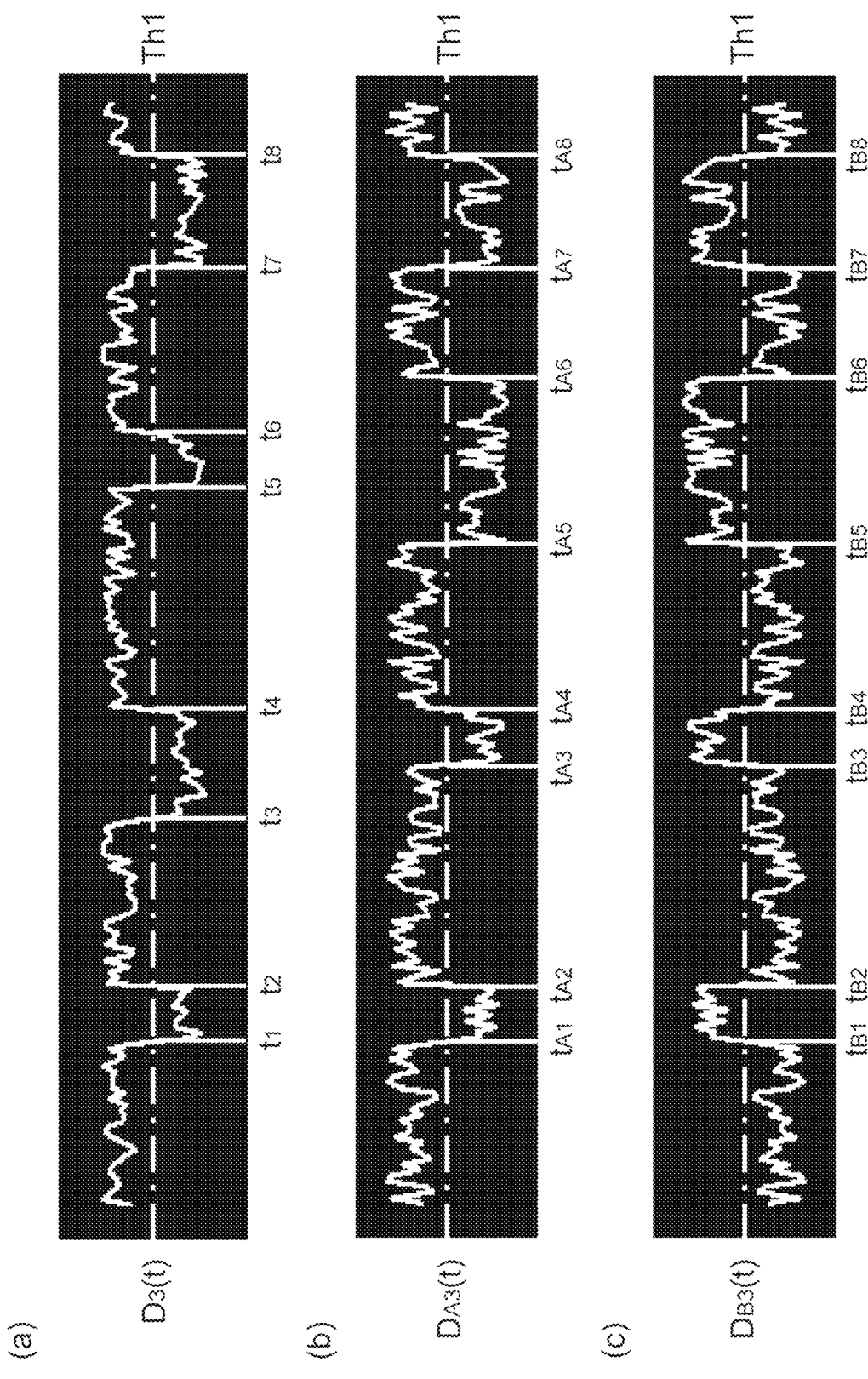
FIG. 8 is a diagram illustrating a time waveform indicated by waveform data to be processed by a calculation unit 26 illustrated in FIG. 2.
Figure 9:
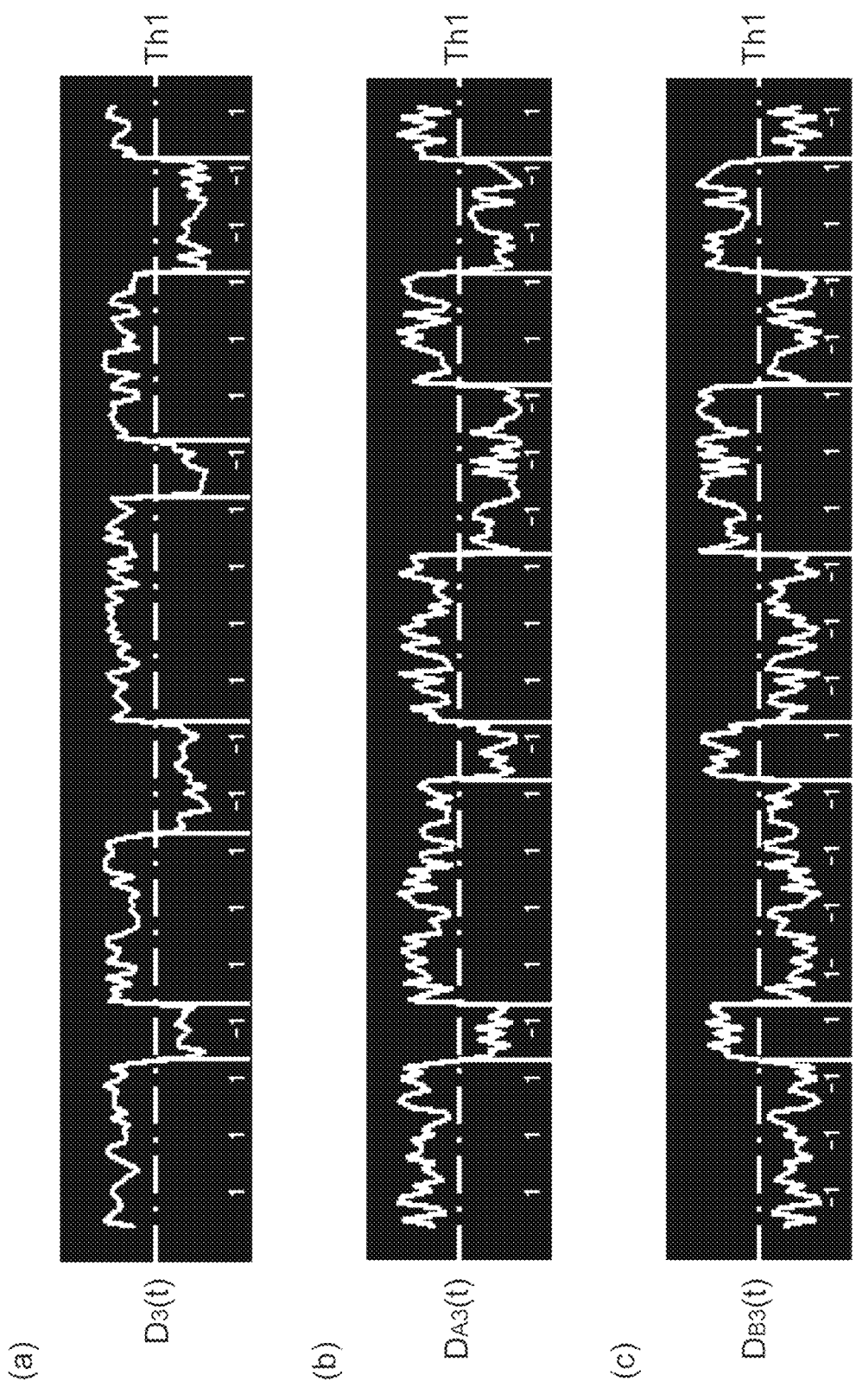
FIG. 9 is a diagram illustrating the time waveform indicated by the waveform data to be processed by the calculation unit 26 illustrated in FIG. 2.

Here, a correspondence degree calculation procedure of the calculation unit 26 will be described in detail. FIGS. 8 and 9 illustrate examples of the waveform data to be processed by the calculation unit 26.

As an example of the correspondence degree calculation procedure, an evaluation value for evaluating whether or not the rising and falling timings in the time waveforms of two waveform data items to be calculated correspond to each other is calculated as the degree of correspondence. For example, in a case in which processing targets are waveform data $D_3(t)$ indicating a time waveform illustrated in a portion (a) of FIG. 8 and waveform data $D_{A3}(t)$ indicating a time waveform illustrated in a portion (b) of FIG. 8, the calculation unit 26 determines whether or not the amplitude of the time waveform is greater than a predetermined threshold Th1 in a predetermined clock cycle for each data item and records a change timing when the determination result changes. The recorded change timing is the rising and falling timings of the time waveform. For example, the rising and falling timings in the time waveform illustrated in the portion (a) of FIG. 8 are recorded as change timings $t_1$ to $t_8$ and the rising and falling timings in the time waveform illustrated in the portion (b) of FIG. 8 are recorded as change timings $t_{41}$ to $t_{48}$.

Then, the calculation unit 26 evaluates whether or not the difference between the recorded change timings in two waveform data items is within a certain time range (for example, one clock cycle) using scores and adds the evaluated scores for all of the change timings. Further, the calculation unit 26 calculates the percentage of the sum of the scores at all of the change timings as the degree of correspondence. For example, in the examples of the time waveforms illustrated in the portion (a) and the portion (b) of FIG. 8, score 2 is counted in a case in which the change timings correspond to each other once and it is evaluated that five change timings correspond to each other among eight change timings. Therefore, the degree of correspondence is calculated as 62.5% (=2×5/(2×8)).

In the calculation procedure, in a case in which waveforms are acquired by EOP, the degree of correspondence between waveform data items indicating the time waveforms with opposite phases is calculated as the same value. For example, a case is considered in which the processing targets are the waveform data $D_3(t)$ indicating the time waveform illustrated in the portion (a) of FIG. 8 and waveform data $D_{B3}(t)$ illustrated in a portion (c) of FIG. 8 which indicates a time waveform with a phase opposite to the phase of the time waveform of the waveform data $D_{A3}(t)$. Change timings $t_{B1}$ to $t_{B8}$ recorded for the waveform data $D_{B3}(t)$ correspond to the change timings $t_{41}$ to $t_{48}$ in the waveform data $D_{A3}(t)$. Therefore, the degree of correspondence between the waveform data $D_3(t)$ and the waveform data $D_{B3}(t)$ is calculated as 62.5% which is the same value as described above.

Incidentally, the operator may input any value as the threshold value used in the above-mentioned calculation procedure or the threshold value may be automatically set on the basis of the waveform data to be processed. For example, the median of the maximum value and the minimum value of the waveform data is set as an initial value of a first threshold value and the average of the average value of values equal to or greater than the threshold value of the waveform data divided into the upper and lower parts by the threshold value and the average value of values equal to or less than the threshold value is calculated as a first-stage threshold value. In some cases, the threshold value may be determined here. However, in a case in which the operator determines that the threshold value is not appropriate, the same operation may be repeatedly performed again or a plurality of times to calculate the final threshold value.

In addition, as another example of the correspondence degree calculation procedure, the result of comparison with the threshold value in the time waveforms of two waveform data items to be calculated is calculated at a plurality of timings and the degree of correspondence is calculated on the basis of the comparison results at the plurality of timings. For example, in a case in which the processing targets are the waveform data $D_3(t)$ indicating the time waveform illustrated in a portion (a) of FIG. 9 and the waveform data $D_{A3}(t)$ indicating the time waveform illustrated in a portion (b) of FIG. 9, the calculation unit 26 determines whether or not the amplitude of the time waveform is greater than the predetermined threshold Th1 in a predetermined clock cycle for each data item and records the determination result for each clock cycle. For example, in a case in which the amplitude is greater than the threshold value Th1, the determination result is recorded as "1". In a case in which the amplitude is not greater than the threshold value Th1, the determination result is recorded as "−1". The recorded determination result indicates the level (change) of the amplitude of the time waveform. For example, the determination results for each clock cycle in the time waveform illustrated in the portion (a) of FIG. 9 are recorded as "1", "1", "1", and "−1" in chronological order. The determination results for each clock cycle in the time waveform illustrated in the portion (b) of FIG. 9 are recorded as "1", "1", "1", and "−1" in chronological order.

Then, the calculation unit 26 multiplies the values of the determination results recorded between two waveform data items, adds the values in all clock cycles, and calculates the absolute value of the added value. Further, the calculation unit 26 calculates the result obtained by dividing the absolute value of the added value over all clock cycles by the number of clock cycles as the degree of correspondence. For example, in the examples of the time waveforms illustrated in the portion (a) and the portion (b) of FIG. 9, since the added value in all clock cycles is calculated as 14 and the number of clock cycles is 20, the degree of correspondence is calculated as 70% (=14/20).

In the calculation procedure, the degree of correspondence between the waveform data items indicating the time waveforms with opposite phases is calculated as the same value. For example, a case is considered in which the processing targets are the waveform data $D_3(t)$ indicating the time waveform illustrated in the portion (a) of FIG. 9 and the waveform data $D_{B3}(t)$ illustrated in a portion (c) of FIG. 9 which indicates a time waveform with a phase opposite to the phase of the time waveform of the waveform data $D_{A3}(t)$. The signs of the determination results "4", "4", "4", and "1" recorded for the waveform data $D_{B3}(t)$ are reverse to the signs of the determination results for the waveform data $D_{A3}(t)$. Therefore, the degree of correspondence between the waveform data $D_3(t)$ and the waveform data $D_{B3}(t)$ is calculated as 70% which is the same value as described above.

Incidentally, the correspondence degree calculation procedure is not limited to the above-mentioned method, such as time-series analysis for comparing the signal change timings, and other appropriate methods may be selected according to the waveform situation. For example, when a sample in which a normal state and an abnormal state change depending on the operating frequency of a device is analyzed, a clock frequency may be different even in the same test vector section and the waveform to be compared may expand or contract over time. In this case, instead of the simple comparison between the waveform transition timings, it is necessary to compare the waveform transition timings after a process of making the time widths correspond to each other is performed. In the waveform comparison, a method of dynamically expanding and contracting the time may be performed if necessary in addition to the simple comparison between the transition timings.

Returning to FIG. 2 again, the analysis unit 28 analyzes a defective part of the defective semiconductor device 10 on the basis of the correspondence degree image data generated by the image generation unit 27 and outputs analysis data acquired by the analysis. That is, the analysis unit 28 tracks a plurality of optical measurement positions in the substrate coordinate system on the basis of the correspondence degree image data and specifies a position having a high possibility of defect using tracking. Then, the analysis unit 28 acquires detailed waveform data for the position specified to have a high possibility of defect by the tracking and positions before and after the specified position in the defective semiconductor device 10 through the measurement unit 25 and outputs the waveform data, for example, to the display device, the storage medium, or an external device together with data indicating the optical measurement position in the substrate coordinate system. The waveform data is compared with waveform data obtained by logic simulations to narrow down defective parts. Incidentally, in a case in which the tracking result shows that a position is outside the field of view of the correspondence degree image data, the tracking is continuously performed a set number of times. In a case in which the position does not return into the field of view even though the tracking is continuously performed the set number of times, the position that has deviated from the field of view first is set as the center of the next field of view. Then, the setting of optical measurement positions, the execution of optical measurement, the generation of correspondence degree image data, and position tracking are repeated.

Figure 10:
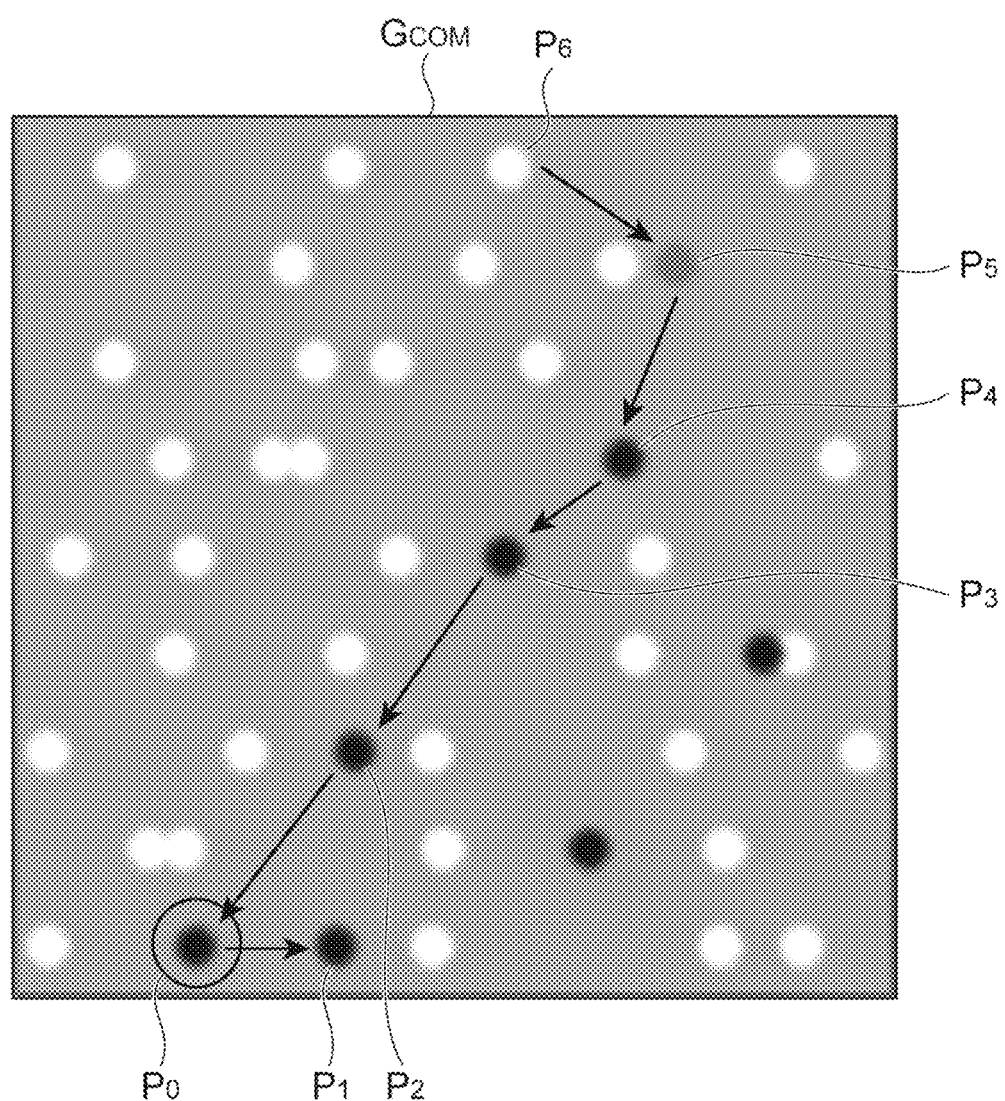
FIG. 10 is a diagram illustrating an example of the correspondence degree image data to be analyzed by an analysis unit 28 illustrated in FIG. 2.

FIG. 10 illustrates an example of the correspondence degree image data of an analysis target by the analysis unit 28. The analysis unit 28 sets a position $P_0$ where tracking starts in the correspondence degree image data $G_{COM}$ illustrated in FIG. 10. For example, an optical measurement position at the lower left corner with a relatively low degree of correspondence on the entire image is set as the position $P_0$. Then, the analysis unit 28 estimates an electrical connection path connected from the position $P_0$ and tracks the positions so as to go up in the signal transmission direction of the connection path. For example, the analysis unit 28 searches for the positions so as to go up in the signal transmission direction in the order of the position $P_0$, a position $P_2$, a position $P_3$, a position $P_4$, and a position $P_5$. In this case, the position $P_1$ and the position $P_2$ exist on the connection path connected to the position $P_0$. However, since a direction from the position $P_0$ to the position $P_1$ is the signal transmission direction and a direction from the position $P_0$ to the position $P_2$ is an upstream direction with respect to the signal transmission direction, the position is tracked from the position $P_0$ to the position $P_2$. In addition, in a case in which there are a plurality of positions connected to the position $P_0$ in the upstream direction, a position having a lower degree of correspondence is tracked. Further, the analysis unit 28 stops the tracking when the position reaches the position $P_6$ where the degree of correspondence is greater than a predetermined threshold value. This configuration makes it possible to estimate a defective signal transmission path in the semiconductor device 10. When the tracking is stopped, the analysis unit 28 specifies a position immediately before the position at the time of the stop as a part having a high possibility of defect.

Here, a connection path which is a candidate of a position tracking route and the signal transmission direction on the path are estimated by creating a circuit diagram of an electric circuit constructed on the semiconductor device 10 from the mask data related to the semiconductor device. In addition, the threshold value for determining the stop of the tracking may be automatically calculated and set from, for example, the distribution of the degrees of correspondence.

Here, a function of creating a circuit diagram of an electric circuit on the semiconductor device 10 by the analysis unit 28 will be described.

Figure 11:
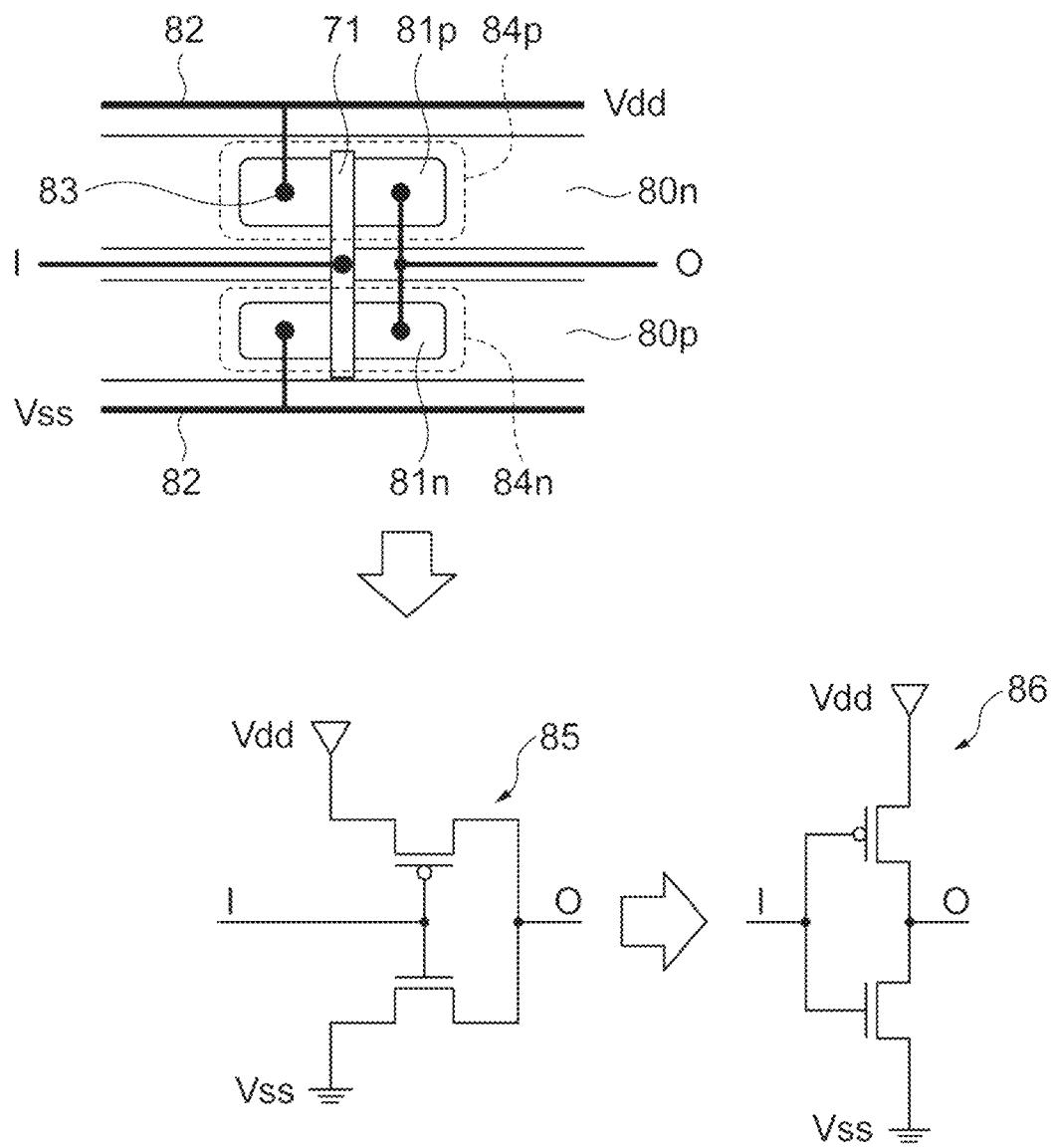
FIG. 11 is a diagram for describing an example of a function of creating a circuit diagram from master data.

FIG. 11 is a diagram for describing an example of the function of creating a circuit diagram from master data. The analysis unit 28 recognizes the layout of, for example, a gate layer, a diffusion layer, a metal layer, a contact, and a through hole in the semiconductor device 10 on the basis of the master data. For example, as illustrated in FIG. 11, the analysis unit 28 recognizes the layout of a p-type diffusion layer 81$p$, an n-type diffusion layer 81$n$, a gate layer 71, a metal layer 82, and a contact 83 on an n-type well 80$n$ and a p-type well 80$p$. The analysis unit 28 specifies regions in which the gate layer 71 traverses the diffusion layers 81$p$ and 81$n$ and the contacts 83 are present in the diffusion layers as transistors 84$p$ and 84$n$. When the master data includes a description of whether the diffusion layers 81$p$ and 81$n$ are a p type or an n type, the transistor 84$p$ can be determined to be a p-channel metal-oxide semiconductor (PMOS) and the transistor 84$n$ can be determined to be an n-channel metal-oxide semiconductor (NMOS). In a case in which the description is not included in the master data, it is determined whether the transistor is a PMOS or an NMOS according to whether the pattern 70 (FIG. 4) traversing the center of the gate layer 71 is biased to the upper side or the lower side. Specifically, the transistor is a PMOS in a case in which the length from the pattern 70 to the leading end of the gate layer 71 is large and is an NMOS in a case in which the length is small. In this case, whether the transistor is a PMOS or an NMOS can be determined on the basis of the position where the contact 83 is present. In addition, the analysis unit 28 determines that the metal layer 82 of the PMOS is connected to a power supply voltage Vdd and the metal layer 82 of the NMOS is connected to a ground voltage Vss.

Further, the analysis unit 28 tracks where each terminal (contact 83) of the specified transistors 84$p$ and 84$n$ is connected. When the tracked destination is a terminal of another transistor, the analysis unit 28 recognizes that the contact is connected to the terminal. For the connection destination of each terminal, tracking is performed up to the connection points of the gate layer 71 and the diffusion layers 81$p$ and 81$n$. As a result of the tracking, the analysis unit 28 creates a circuit diagram 85 illustrated in FIG. 11. Further, the analysis unit 28 changes and shapes the direction of the transistor to create a circuit diagram 86 of an inverter. In these circuit diagrams, the terminal connected to the gate layer is created as an input terminal I and the terminal connected to the diffusion layer is created as an output terminal O. However, in a circuit diagram of a transfer gate, in some cases, the terminal connected to the diffusion layer may be created as the input terminal I.

Figure 12:
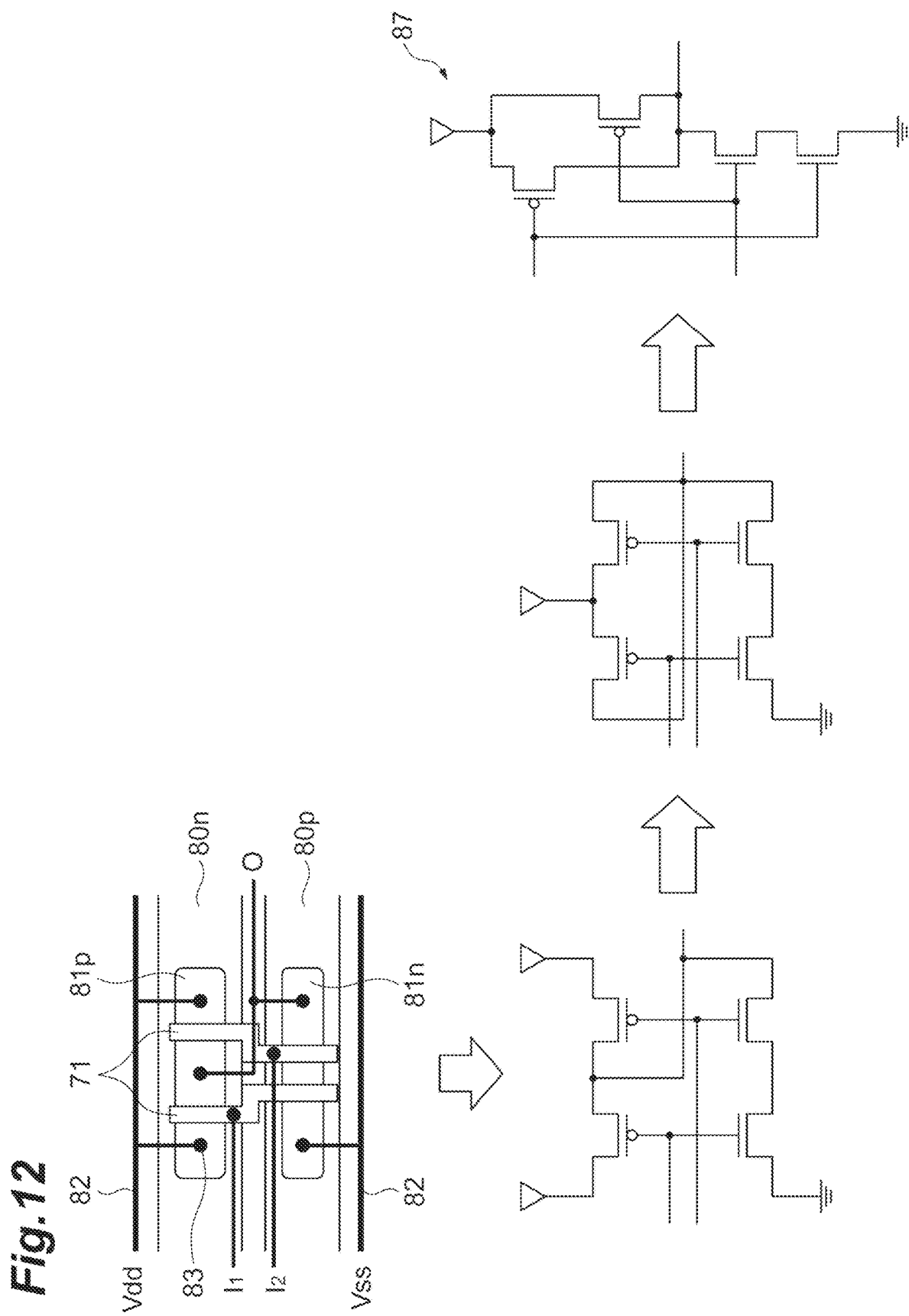
FIG. 12 is a diagram for describing an example of the function of creating a circuit diagram from master data.
Figure 13:
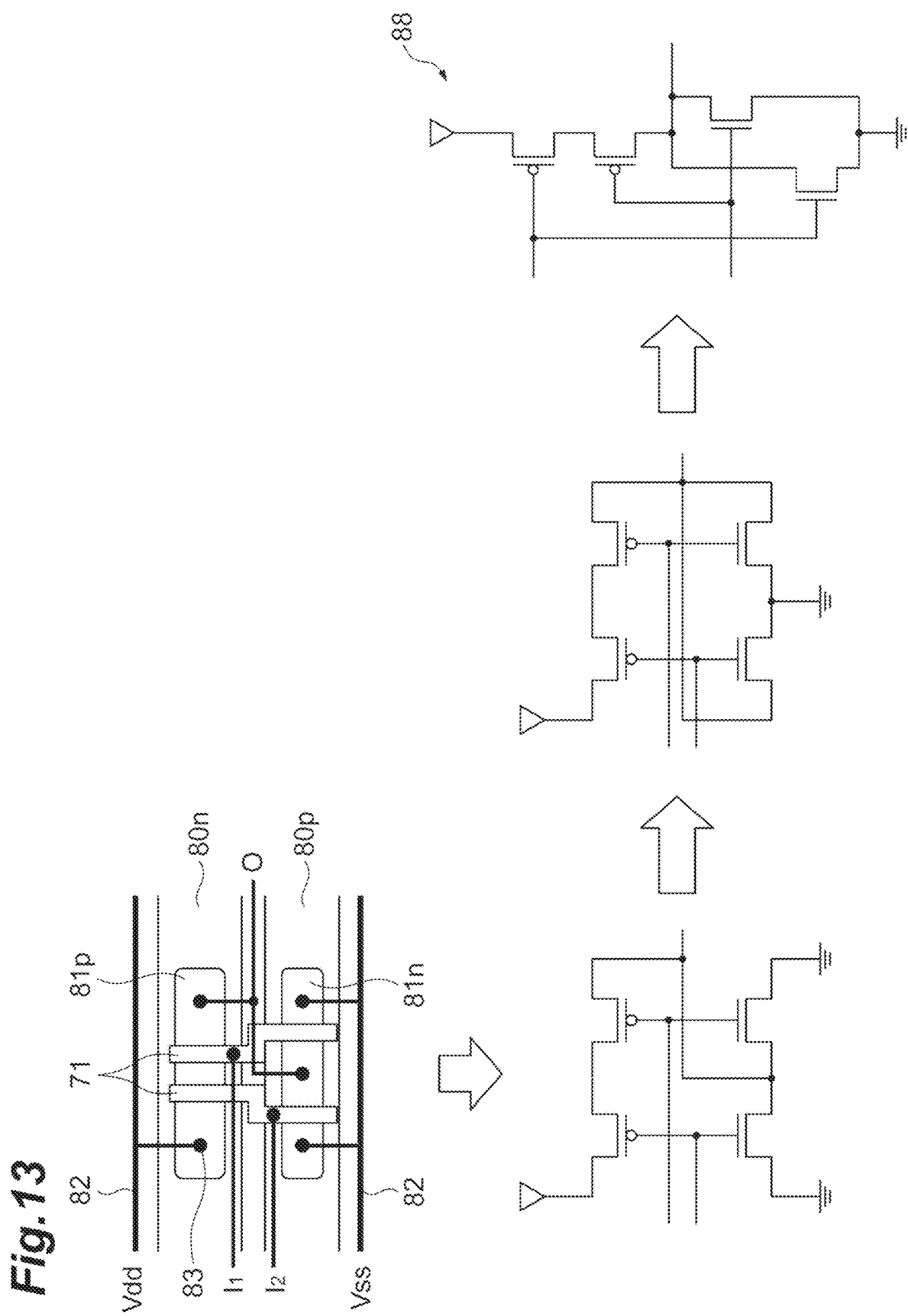
FIG. 13 is a diagram for describing an example of the function of creating a circuit diagram from master data.
Figure 14:
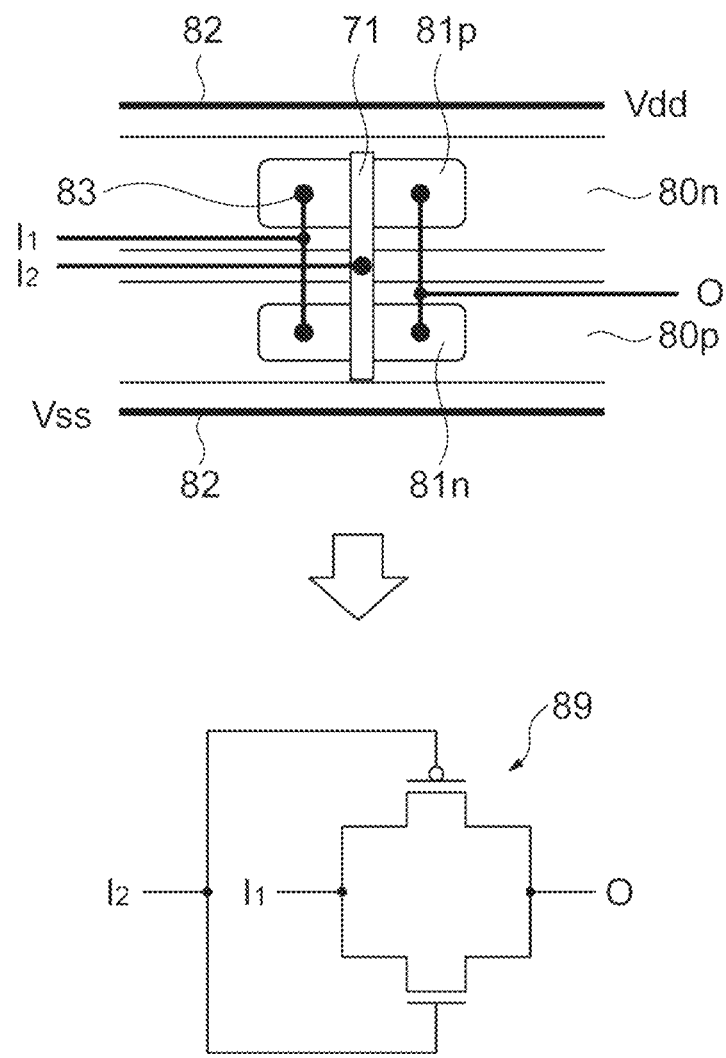
FIG. 14 is a diagram for describing an example of the function of creating a circuit diagram from master data.
Figure 15:
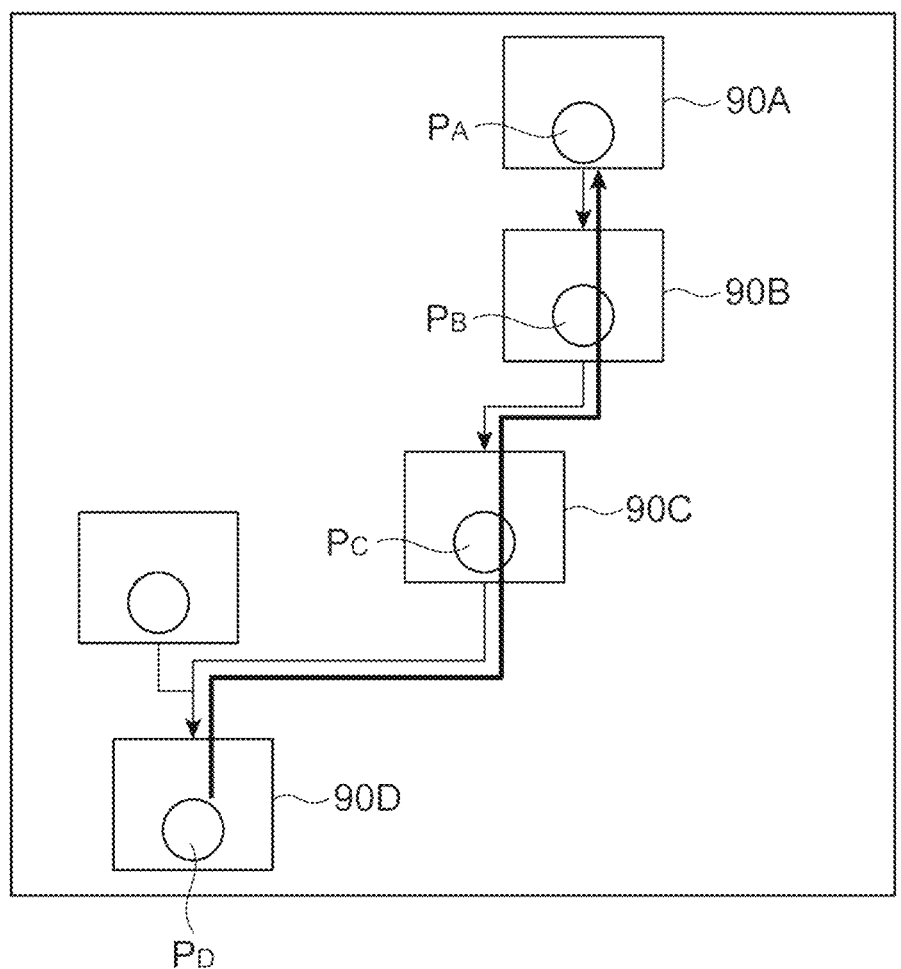
FIG. 15 is a diagram for describing an image of position tracking by the analysis unit 28 illustrated in FIG. 2.

FIGS. 12, 13, and 14 illustrate other circuit diagrams created by the analysis unit 28 from the master data. As illustrated in FIGS. 12, 13, and 14, the analysis unit 28 creates, for example, a circuit diagram 87 of a NAND circuit, a circuit diagram 88 of a NOR circuit, and a circuit diagram 89 of a transfer gate, which include a connection relationship between inputs and outputs in each circuit block, from the master data using the same procedure. However, the analysis unit 28 may not create the detailed circuit diagrams as illustrated in FIGS. 11 to 14, but may create only information related to the connection relationship between the inputs and the outputs in the circuit blocks. For example, as illustrated in FIG. 15, when the transmission of signals in the order of circuit blocks 90A, 90B, 90C, and 90D can be recognized, it is possible to track positions in the order of an optical measurement position $P_D$ in the circuit block 90D, an optical measurement position $P_C$ in the circuit block 90C, an optical measurement position $P_B$ in the circuit block 90B, and an optical measurement position $P_A$ in the circuit block 90A on the basis of the degree of correspondence in the correspondence degree image data.

Figure 16:
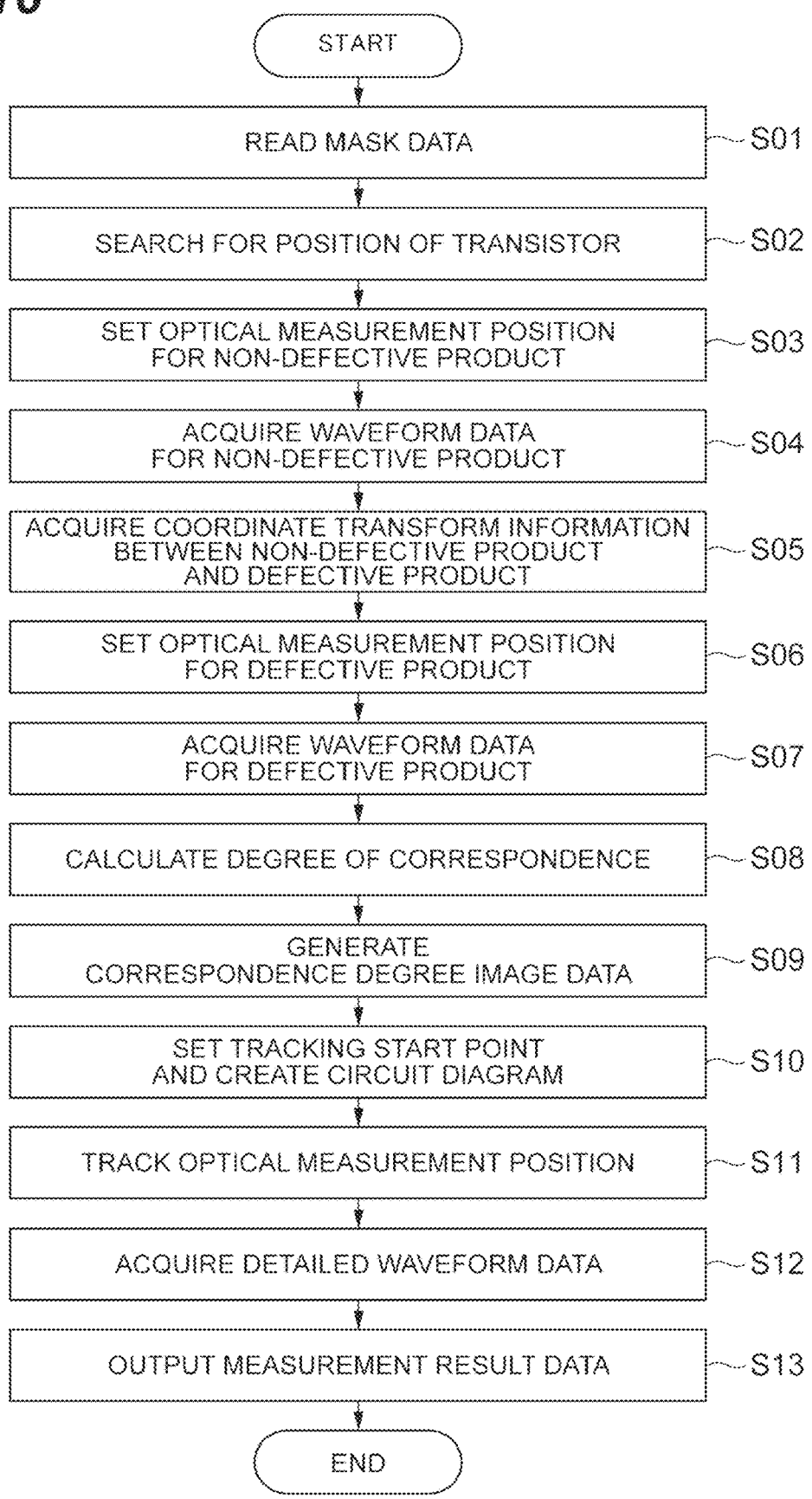
FIG. 16 is a flowchart illustrating an operation procedure of an analysis process of the semiconductor device inspection apparatus 1 according to the embodiment.

Next, the optical measurement operation of the semiconductor device inspection apparatus 1 and the flow of an analysis method according to the embodiment will be described in detail. FIG. 16 is a flowchart illustrating the procedure of the optical measurement operation of the semiconductor device inspection apparatus 1.

First, when optical measurement is started by the input of an instruction from the operator of the semiconductor device inspection apparatus 1, the data reading unit 23 of the control device 18 reads mask data related to the semiconductor device 10 (Step S01). Then, the setting unit 24 of the control device 18 searches for the position of a transistor with a relatively high driving capability in the semiconductor device 10 (Step S02). Then, a non-defective semiconductor device 10 is set in the semiconductor device inspection apparatus 1 and the setting unit 24 of the control device 18 sets an optical measurement position on the semiconductor device 10 in the measurement coordinate system (Step S03). Then, the measurement unit 25 of the control device 18 controls the execution of optical measurement for the set optical measurement position and acquires the waveform data of the intensity of reflected light for each optical measurement position (Step S04; a first measurement step).

Then, a defective semiconductor device 10 is set in the semiconductor device inspection apparatus 1 and the control device 18 acquires coordinate transform information for the correspondence between the optical measurement position in the measurement coordinate system at the time of optical measurement for the non-defective semiconductor device 10 and the optical measurement position in the measurement coordinate system at the time of optical measurement for the defective semiconductor device 10 (Step S05). Then, the setting unit 24 of the control device 18 sets an optical measurement position on the semiconductor device 10 in the measurement coordinate system (Step S06). Then, the measurement unit 25 of the control device 18 controls the execution of optical measurement for the set optical measurement position and acquires the waveform data of the intensity of reflected light for each optical measurement position (Step S07; a second measurement step).

In addition, the calculation unit 26 of the control device 18 calculates the degree of correspondence for each of a plurality of optical measurement positions on the basis of the waveform data of the non-defective semiconductor device and the defective semiconductor device (Step S08; a calculation step). Then, the image generation unit 27 of the control device 18 generates correspondence degree image data in which the calculated degree of correspondence has been mapped to the image coordinates (Step S09; an image generation step).

Then, the analysis unit 28 of the control device 18 sets a position measurement start point in the correspondence degree image data and creates a circuit diagram of a region including the start point on the basis of the master data (Step S10; an analysis step). Then, the analysis unit 28 tracks the optical measurement position while estimating a connection path and a signal transmission direction on the correspondence degree image data using the circuit diagram (Step S11; an analysis step). Then, the analysis unit 28 sets a plurality of light measurement positions on the basis of the tracking results and acquires the detailed waveform data of the intensity of reflected light at the positions (Step S12; an analysis step). Finally, the analysis unit 28 associates the acquired detailed waveform data with corresponding data indicating optical measurement positions in the substrate coordinate system and outputs the associated data (Step S13).

Figure 17:
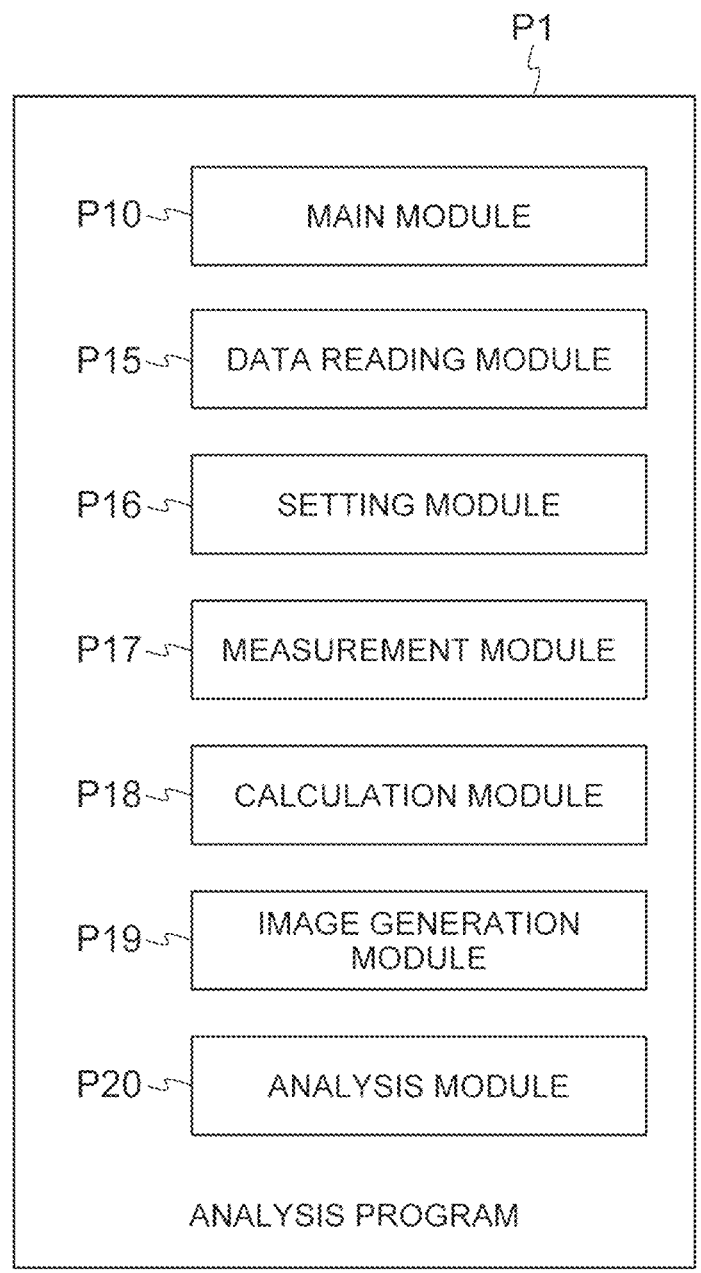
FIG. 17 is a block diagram illustrating the configuration of an analysis program according to an embodiment.

Next, an analysis program for causing a computer to function as the control device 18 of the semiconductor device inspection apparatus 1 will be described with reference to FIG. 17.

An analysis program P1 includes a main module P10, a data reading module P15, a setting module P16, a measurement module P17, a calculation module P18, an image generation module P19, and an analysis module P20.

The main module P10 is a portion that controls the overall analysis operation. Functions implemented by executing the data reading module P15, the setting module P16, the measurement module P17, the calculation module P18, the image generation module P19, and the analysis module P20 are the same as the functions of the data reading unit 23, the setting unit 24, the measurement unit 25, the calculation unit 26, the image generation unit 27, and the analysis unit 28 of the control device 18, respectively.

The analysis program P1 is provided by a computer-readable recording medium, such as a CD-ROM, a DVD, or a ROM, or a semiconductor memory. In addition, the analysis program P1 may be provided as computer data signals superimposed on a carrier wave through a network.

According to the semiconductor device inspection apparatus 1, the degree of correspondence between the waveform data items which are the optical measurement results at a plurality of corresponding positions of the defective semiconductor device 10 and the non-defective semiconductor device 10 is calculated and the correspondence degree image data in which the degree of correspondence has been mapped onto the coordinates is generated. Further, a defective part of the defective semiconductor device 10 is analyzed on the basis of the correspondence degree image data. Therefore, it is possible to analyze a defective part on the basis of the distribution of the degree of correspondence between the time waveforms on the semiconductor device 10 and thus to effectively analyze the defective part.

In addition, in the semiconductor device inspection apparatus 1, the positions are tracked from a position with a relatively low degree of correspondence on the coordinates to a position with a relatively high degree of correspondence on the coordinates on the basis of the correspondence degree image data to specify a defective part. This configuration makes it possible to analyze a part causing a defect using position tracking and to more effectively specify a defective part.

In addition, a circuit diagram is created on the basis of the mask data related to the semiconductor device 10 and a position tracking route is determined on the basis of the circuit diagram. In this case, it is possible to perform position tracking while considering the signal transmission direction between circuit blocks on the basis of the circuit diagram and to reliably specify a defective part.

Further, the degree of correspondence in the correspondence degree image data is calculated as the degree of correspondence between changes in the amplitudes of the time waveforms in the waveform data items. In this case, it is possible to appropriately specify a defective part of the semiconductor device 10 using the degree of correspondence between the changes in the amplitudes. In addition, the degree of correspondence in the correspondence degree image data may be calculated as the degree of correspondence between the rising and falling timings in the waveform data items. In this case, it is possible to easily specify a defective part of the semiconductor device 10.

Further, light is emitted to a plurality of positions of the defective/non-defective semiconductor devices 10 to which an electric signal has been input, reflected light from the plurality of positions is measured, and waveform data is acquired. Therefore, it is possible to easily analyze a defective part of the semiconductor device 10 by measuring reflected light generated by the emission of light to a plurality of positions in the semiconductor device 10.

Various embodiments of the present invention have been described above. However, the present invention is not limited to the above-described embodiments and may be modified without departing from the scope and spirit described in the claims or may be applied to other configurations.

For example, in the above-described embodiments, the degree of correspondence between the waveform data items which are the results of optical measurement at a plurality of corresponding positions of the defective semiconductor device 10 and the non-defective semiconductor device 10 is calculated and a defective part of the defective semiconductor device 10 is analyzed on the basis of the correspondence degree image data generated by mapping the degree of correspondence onto the coordinates. However, the correspondence degree image data is not necessarily generated. For example, a list of the degrees of correspondence at a plurality of positions may be generated and a defective part of the defective semiconductor device may be analyzed on the basis of the list in which the degrees of correspondence are sorted and displayed in ascending order.

In addition, in the above-described embodiments, the light source 2 is not necessarily provided and optical measurement for the semiconductor device 10 may be performed by measuring light emission at the optical measurement position. For example, in the semiconductor device inspection apparatus 1, optical measurement using TRIEM may be performed for the defective semiconductor device 10 and the non-defective semiconductor device 10 to which an electric signal has been input. In the transistors in the defective semiconductor device 10 and the non-defective semiconductor device 10, light emission corresponding to hot carriers which travel between the source and the drain at the timing when a gate voltage changes between a high voltage and a low voltage is detected by TRIEM.

However, in the semiconductor device inspection apparatus 1 having the function of performing optical measurement using TRIEM, the waveform data of light emission intensity acquired by the measurement unit 25 includes a spike at the light emission timing of the transistor. Therefore, the semiconductor device inspection apparatus 1 has a function of calculating the degree of correspondence as follows.

Figure 18:
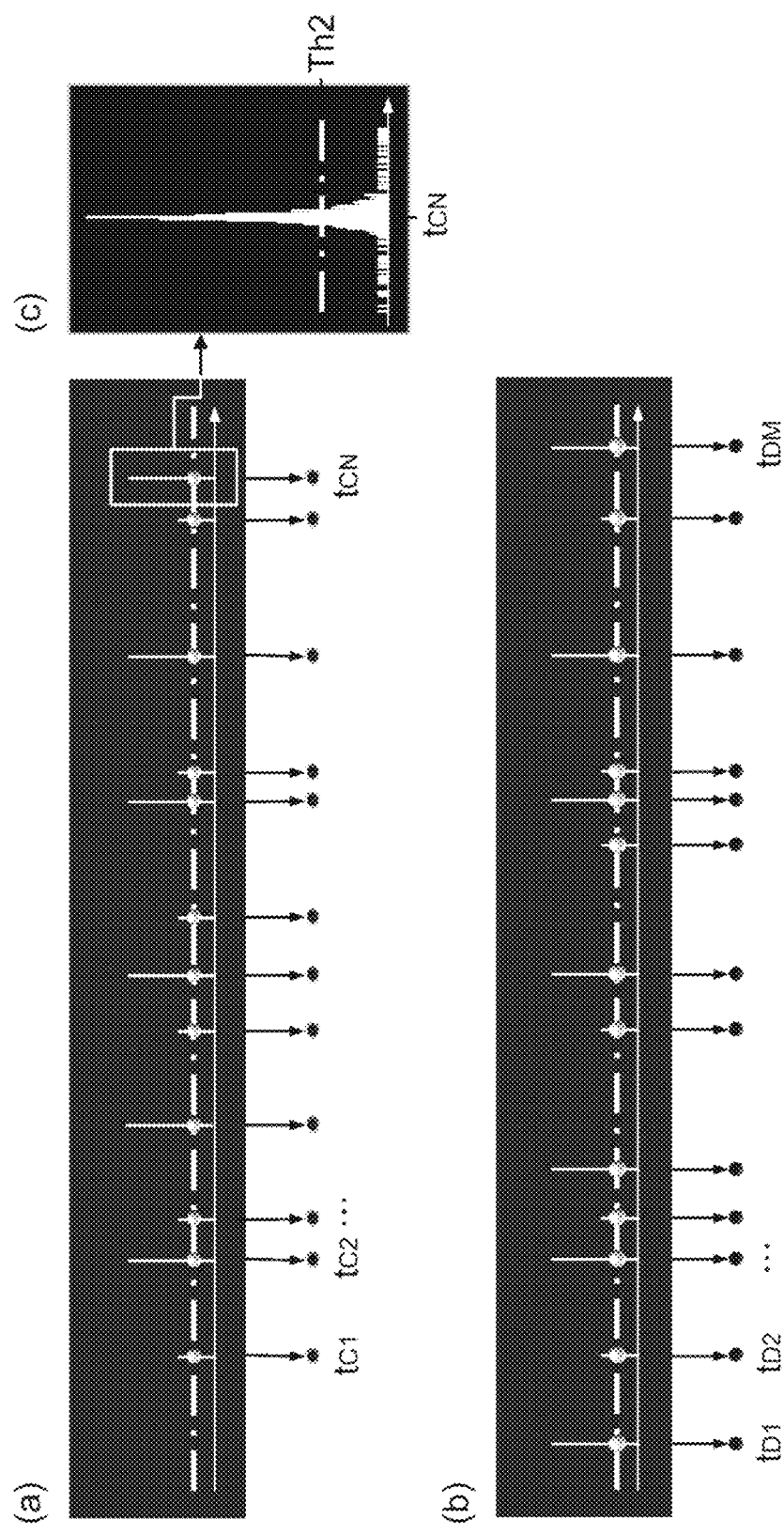
FIG. 18 is a diagram illustrating a time waveform indicated by waveform data to be processed in a modification example.

FIG. 18 illustrates an example of the waveform data of light emission intensity acquired by optical measurement using TRIEM for corresponding optical measurement positions in a control device 18 according to a modification example. As illustrated in a portion (a) of FIG. 18, for the defective semiconductor device 10, a spike is observed at light emission timings of a plurality of time points $t_{c1}$, $t_{c2}$, ... $t_{cN}$ (N is an integer). As illustrated in a portion (b) of FIG. 18, for the non-defective semiconductor device 10, a spike is observed at light emission timings of a plurality of time points $t_{D1}$, $t_{D2}$, ... $t_{DM}$ (M is an integer). For the waveform data, the calculation unit 26 of the control device 18 compares the amplitude of the waveform data with a predetermined threshold value Th2 to detect a plurality of spike generation timings $t_{c1}$, $t_{c2}$, ... $t_{cN}$, $t_{D1}$, $t_{D2}$, ... $t_{DM}$ in each waveform data item as illustrated in a portion (c) of FIG. 18. In this case, if the time when the amplitude is greater than the threshold value Th2 is continuous, the calculation unit 26 detects the center time point as the spike generation timing. When the amplitude greater than the threshold value Th2 is not maintained for a predetermined period of time, the calculation unit 26 ignores the time as noise.

Then, the calculation unit 26 according to this modification example evaluates the correspondence/non-correspondence between the generation timings $t_{C1}$, $t_{C2}$, ... $t_{CN}$ detected in one waveform data item and the generation timings $t_{D1}$, $t_{D2}$, ... $t_{DM}$ detected in the other waveform data item and calculates the degree of correspondence on the basis of the values of the evaluation results. For example, the calculation unit 26 may give evaluation scores "1"/"0" to the correspondence/non-correspondence, calculate the percentage of the total evaluation score with respect to the total number of times the correspondence/non-correspondence between the generation timings are evaluated, and use the percentage as the degree of correspondence. In this case, the correspondence/non-correspondence between the generation timings may be evaluated as follows in order to remove the influence of jitter in the measurement system: when the deviation between the generation timings is equal to or less than a predetermined period such as half of the clock cycle of the measurement system, it is evaluated that the generation timings correspond to each other.

For a method for calculating the degree of correspondence between the waveform data items in the calculation unit 26 according to the above-described embodiment, the following method using correlation calculation other than the above-mentioned method can be used. Here, it is assumed that one waveform data item is time-series data x(k) (k is a natural number from 1 to N) at a plurality of timings and the other waveform data item is time-series data y(k) (k is a natural number from 1 to N) at a plurality of timings. Here, each of x(k) and y(k) is data having its average value as a center value.

First, as illustrated in the following Expression (1), the two waveform data items are multiplied at each timing k and the multiplied values are added up to the timings k (=1 to N) to calculate a correlation value R.

[Equation 1]

$$R = \sum_{k=1}^{N} x(k) y(k) \quad (1)$$

Then, as illustrated in the following Expressions (2) to (3), the correlation value R is divided by the square root of the sum of the squares of each waveform data item and the absolute value of the calculated value is calculated as the degree of correspondence S. Even in a case in which the waveforms have different sizes, the values are normalized by these calculation formulas and the maximum value of the degree of correspondence S is 1. Here, the absolute value is calculated because the EOP waveform may be inverted depending on conditions and the degree of correspondence is calculated as a high value in a case in which the waveform is inverted. Incidentally, a general formula for calculating a correlation coefficient is represented by an expression obtained by removing the sign of the absolute value from Expression (2).

[Equation 2]

$$S = \left| \frac{R}{PxPy} \right| \quad (2)$$

[Equation 3]

$$Px = \sqrt{\sum_{k=1}^{N} \{x(k)\}^2}, \, Py = \sqrt{\sum_{k=1}^{N} \{y(k)\}^2} \quad (3)$$

In addition, in the above description, data having the average value of EOP waveform data as a center value has been used. However, in the case of general data, the degree of correspondence S may be calculated using the following average value of the waveform data items x(k) and y(k) as in the following Expression (4):

[Equation 4]

$\bar{x}, \bar{y}$

[Equation 5]

$$S = \left| \frac{\sum_{k=1}^{N} \{x(k) - \bar{x}\}\{y(k) - \bar{y}\}}{\sqrt{\sum_{k=1}^{N} \{x(k) - \bar{x}\}^2} \sqrt{\sum_{k=1}^{N} \{y(k) - \bar{y}\}^2}} \right| \quad (4)$$

FIGS. 19 to 21 illustrate time waveforms indicated by two waveform data items whose degree of correspondence S is to be calculated. Two waveform data items illustrated in a portion (a) and a portion (b) of FIG. 19 have time waveforms obtained by adding a noise element of 0.2 to the waveforms that completely correspond to each other. The "waveform to which a noise element is added" refers to a waveform obtained by adding a random number corresponding to the width of the numerical value to the height ±1 of the waveform. In a case in which the degree of correspondence between the waveform data items is calculated using the above-mentioned Expression (4), the degree of correspondence S is calculated as 0.997. Two waveform data items illustrated in a portion (a) and a portion (b) of FIG. 20 have time waveforms obtained by adding a noise element of 2.0 to the waveforms that completely correspond to each other. In a case in which the degree of correspondence between the waveform data items is calculated, the degree of correspondence S is calculated as 0.734. Two waveform data items illustrated in a portion (a) and a portion (b) of FIG. 21 have time waveforms obtained by adding a noise element of 4.0 to the waveforms that completely correspond to each other. In a case in which the degree of correspondence between the waveform data items is calculated, the degree of correspondence S is calculated as 0.402. That is, in the calculation using the correlation coefficient, noise superimposed on the waveform affects the degree of correspondence. Noise varies depending on the conditions of the device, samples, or peripheral devices when the waveform is acquired. In a case in which the threshold value is uniformly provided and the degree of correspondence is classified, a determination error occurs. Therefore, some kinds of correction calculation are required.

Here, Sigmoid correction is used as the correction calculation method. The Sigmoid correction is a correction method using a Sigmoid function represented by the following Expression (5).

[Equation 6]

$$Sc = \frac{1}{1 + \exp\{-a(S - h)\}} \quad (5)$$

In addition to the correction using the above-mentioned Expression (5), in a situation in which the degree of correspondence is relatively high, γ correction can be used and the degree of correspondence S may be corrected by various correction methods. However, in some cases, the flexibility of correction is insufficient in the γ correction. It is desirable to apply the Sigmoid function for more effective correction. In the above-mentioned Expression (5), the value S is the degree of correspondence before correction and the value Sc indicates the corrected degree of correspondence. Further, the Sigmoid function in the above-mentioned Expression (5) includes a gain a and a threshold value h as parameters. The gain a is a value indicating how rapidly the corrected value is changed and the threshold value h is a value indicating from where the corrected value is changed. When this correction expression is applied, the appropriate gain a and the appropriate threshold value h are set in advance.

The following method can be applied as a method for setting the parameters included in Expression (5). First, the waveform data of parts in which it is known that the acquired waveforms correspond to each other is acquired for both a non-defective product and a defective product. As the part, a part in which the EOP waveform is easily acquired and which operates reliably, such as a clock buffer, may be selected. Even the degree of correspondence S calculated for the acquired waveform data items is reduced due to the influence of noise. In a case in which the calculated degree of correspondence S is, for example, 0.5, the actual degree of correspondence of the waveforms is assumed to be high. Therefore, the parameters are set such that the corrected degree of correspondence Sc becomes a high value (for example, 0.95). In addition, the above-described Expression (5) can be deformed into the following Expression (6).

[Equation 7]

$$h = S + \frac{1}{a}\ln\left(\frac{1}{Sc} - 1\right) \quad (6)$$

Figure 22:
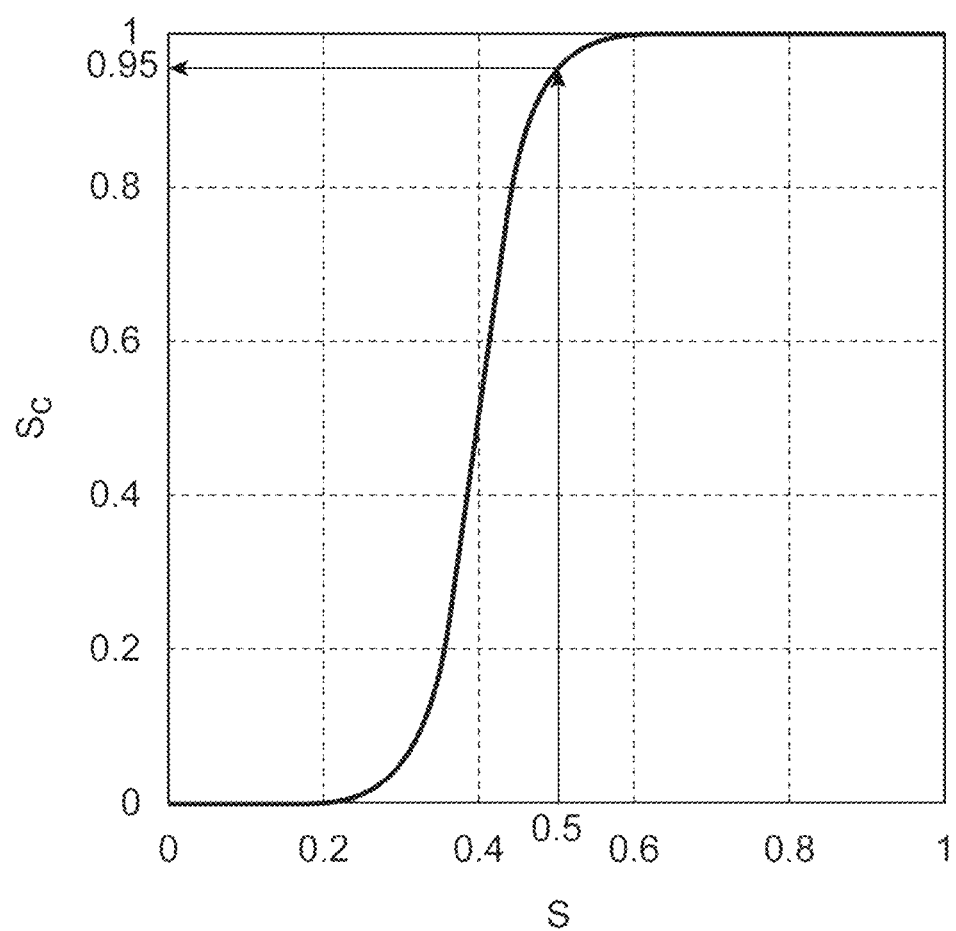
FIG. 22 is a graph showing a relationship between a degree of correspondence S and a corrected value Sc of the degree of correspondence S.

Here, when the condition in which the corrected value Sc is 0.95 in a case in which the gain a is 30 and the calculated degree of correspondence S is 0.5 is set, the threshold value h can be determined to be 0.40 under the condition. FIG. 22 shows the relationship between the corrected value Sc and the degree of correspondence S in which the parameters are determined under the condition. In the relationship, the corrected value Sc sharply changes from 0.95 which is the corrected value Sc for a degree of correspondence S of 0.5 before correction in the direction in which the degree of correspondence S is reduced. Therefore, the corrected value Sc sensitive to a change in the waveform is calculated. At this time, the gain a is set to 30. This value is also set to an appropriate value by the following method.

Figure 23:
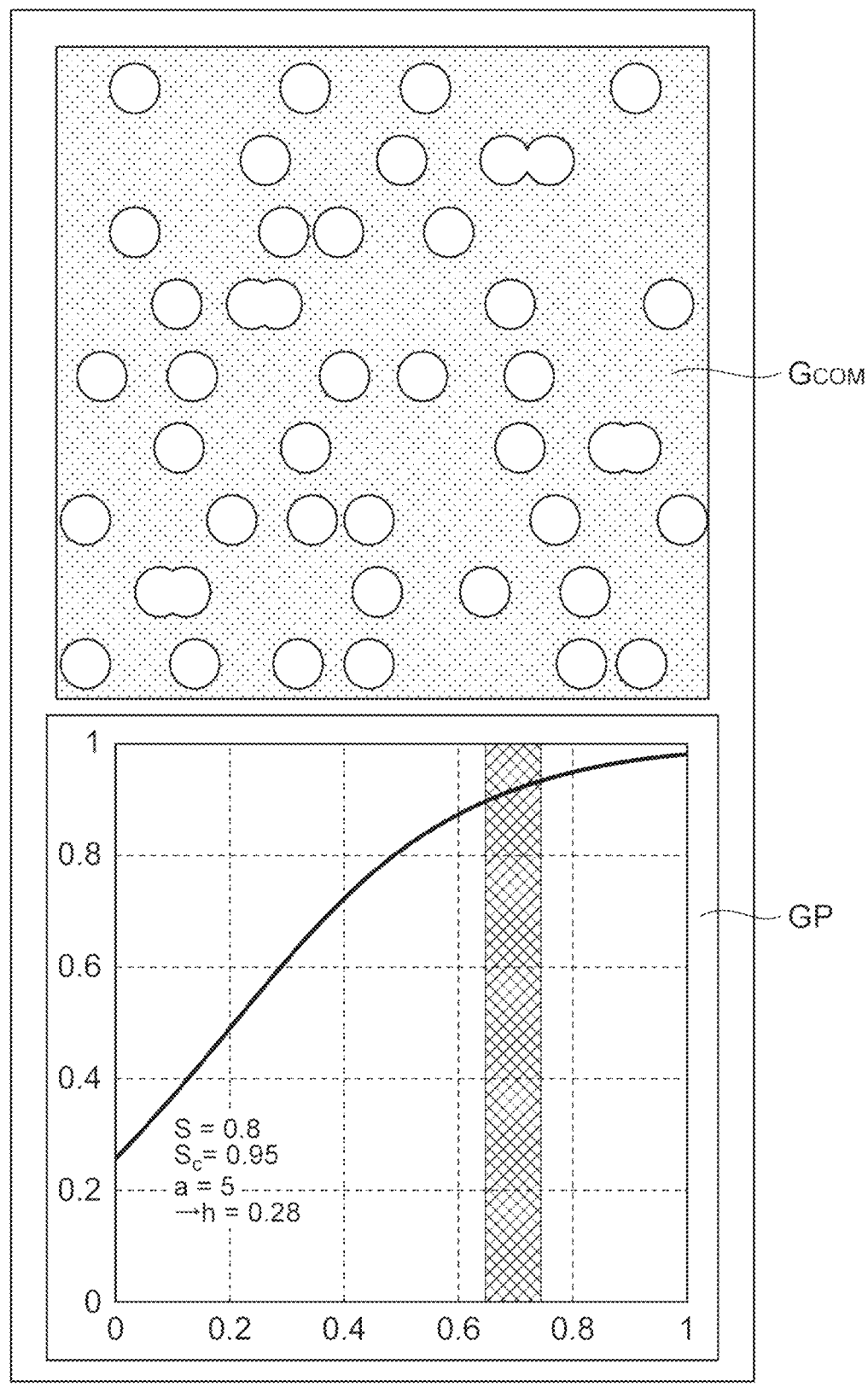
FIG. 23 is a diagram illustrating an image of correspondence degree image data $G_{COM}$ and a correction function graph GP which are displayed side by side by the control device 18.
Figure 24:
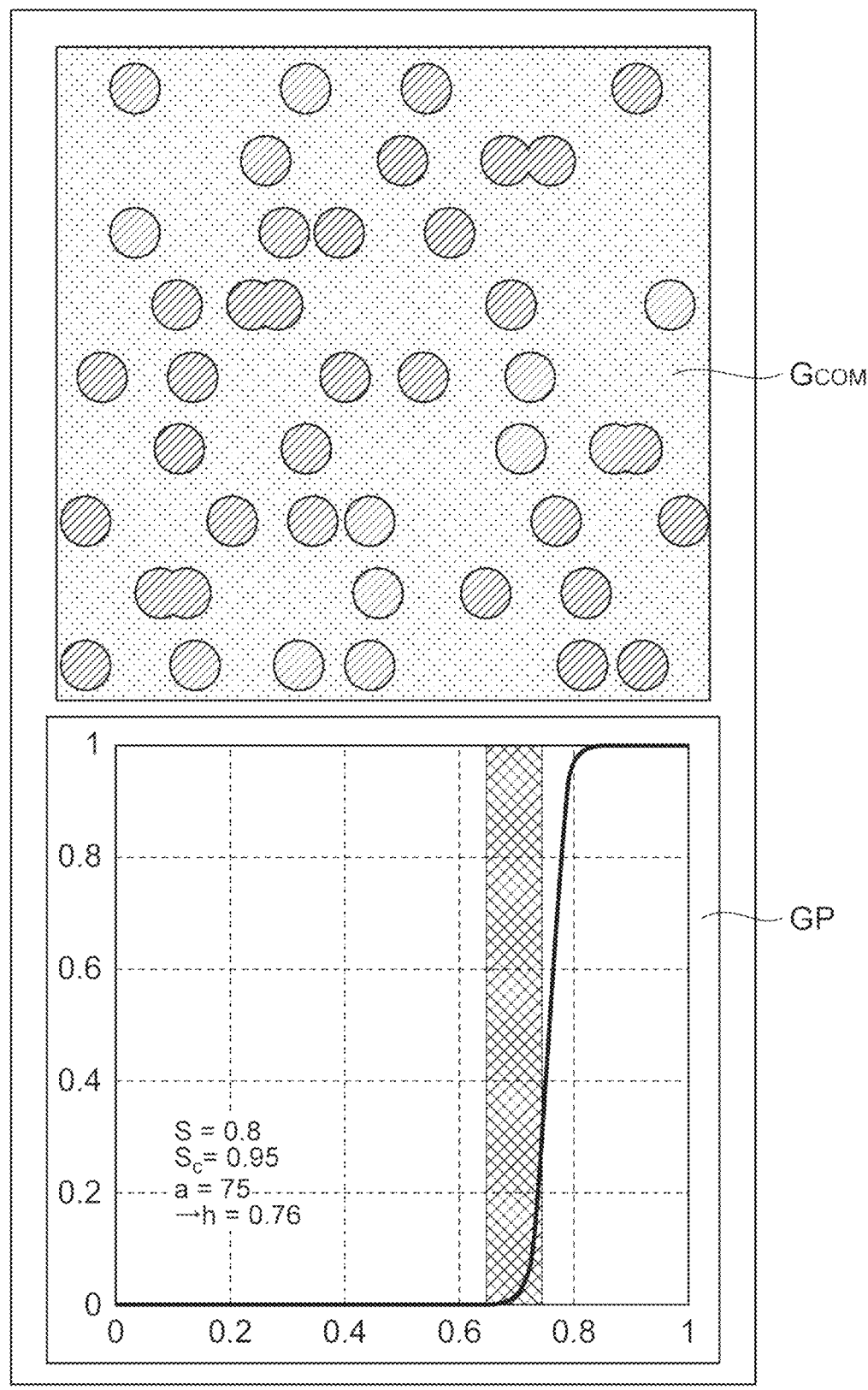
FIG. 24 is a diagram illustrating an image of correspondence degree image data $G_{COM}$ and a correction function graph GP which are displayed side by side by the control device 18.
Figure 25:
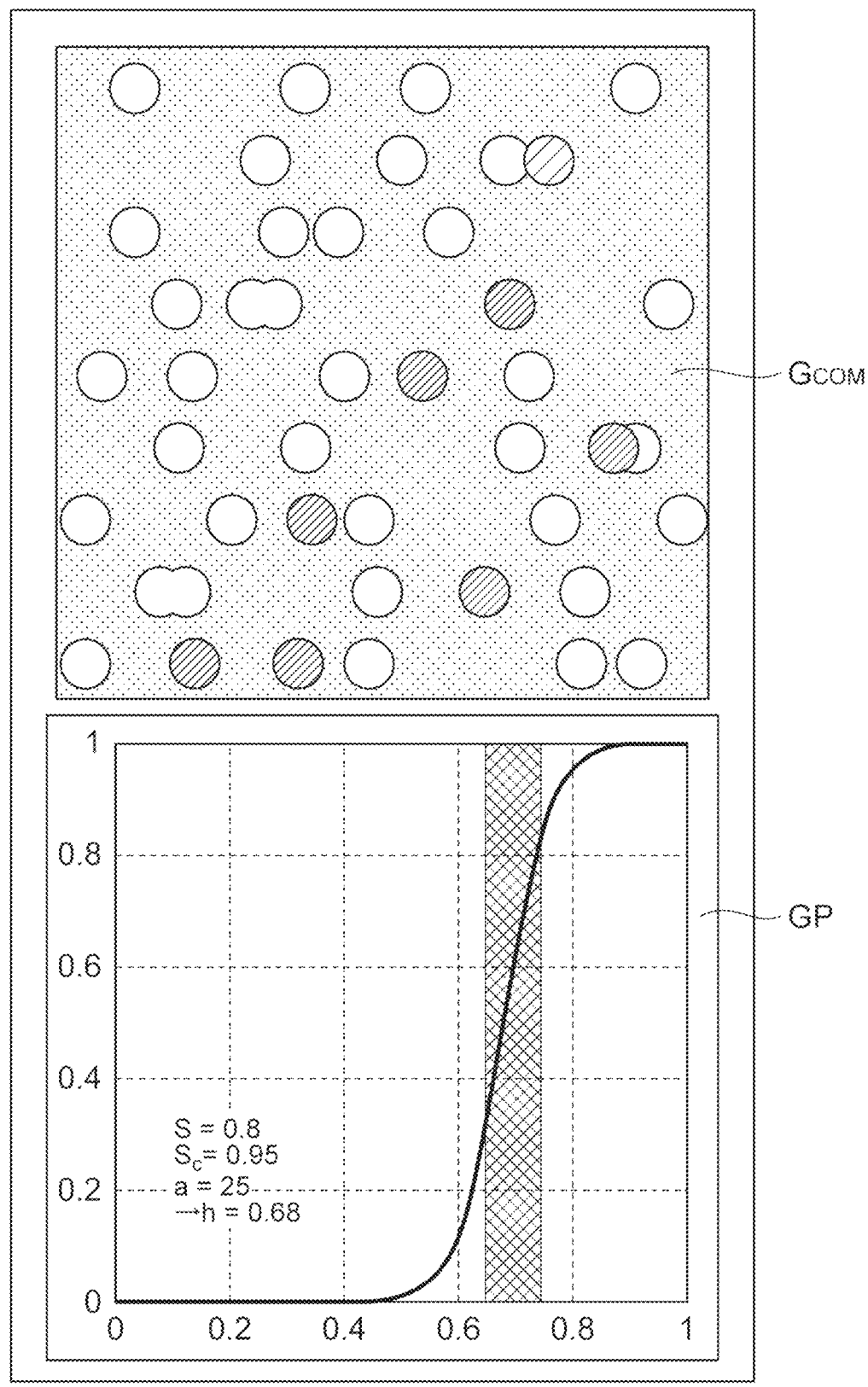
FIG. 25 is a diagram illustrating an image of correspondence degree image data $G_{COM}$ and a correction function graph GP which are displayed side by side by the control device 18.

That is, the following method can be adopted as a method for setting the gain a. Here, the control device 18 is configured to have a function of providing, for example, a scroll bar on the correspondence degree image in a state in which the correspondence degree image is displayed on the screen of the display device using the correspondence degree image data $G_{COM}$ such that the user operates the scroll bar to change the value of the gain a. Further, the control device 18 is configured to have a function of displaying the correspondence degree image acquired in real time on the basis of the degree of correspondence calculated in correspondence with the gain a that varies and a correction function graph GP indicating the relationship between the degree of correspondence S and the corrected value Sc side by side. For example, the correspondence degree image is displayed such that brightness becomes higher as the degree of correspondence becomes higher and becomes lower as the degree of correspondence becomes lower. The function of displaying the correction function graph includes a function of displaying the range of a change in the degree of correspondence S using, for example, hatching. For example, in a case in which the gain a is set to a value smaller than the appropriate value, each point of the correspondence degree image indicates the same high degree of correspondence and all of the points are displayed bright by the above-mentioned function (FIG. 23). Conversely, in a case in which the gain a is set to a value larger than the appropriate value, all of the points are displayed dark (FIG. 24). As such, even in a case in which the gain a is too large or too small, it is difficult to clearly check a change in the degree of correspondence. In contrast, in a case in which the gain a is adjusted to an appropriate value, it is possible to clearly check a difference in the degree of correspondence (FIG. 25). In this case, in the correction function graph GP, the range in which the degree of correspondence S changes falls within the range in which a change in the correction function is large. The use of the function of the control device 18 allows the user to check the correspondence degree image and the correction function graph while changing the value of the gain a and to set the gain a to an appropriate value. Incidentally, threshold value h is calculated and set according to a change in the gain a by the above-mentioned Expression (6) such that the degree of correspondence (for example, 0.8) calculated for parts in which the waveforms correspond to each other is corrected to a preset high corrected value (for example, 0.95).

An example of a process using the correspondence degree calculation method and the parameter setting method will be described.

A portion (a) and a portion (b) of FIG. 26 illustrate the time waveforms of two waveform data items acquired for two parts in which it is known that the acquired waveforms correspond to each other. When the waveform data items were processed, the degree of correspondence S was calculated as 0.964. The parameters are determined such that the corrected degree of correspondence Sc is 0.95 and the range in which the degree of correspondence S changes falls within the range in which a change in the correction function is large. As a result, the gain a was calculated as 15 and the threshold value h was calculated as 0.768.

Figure 27:
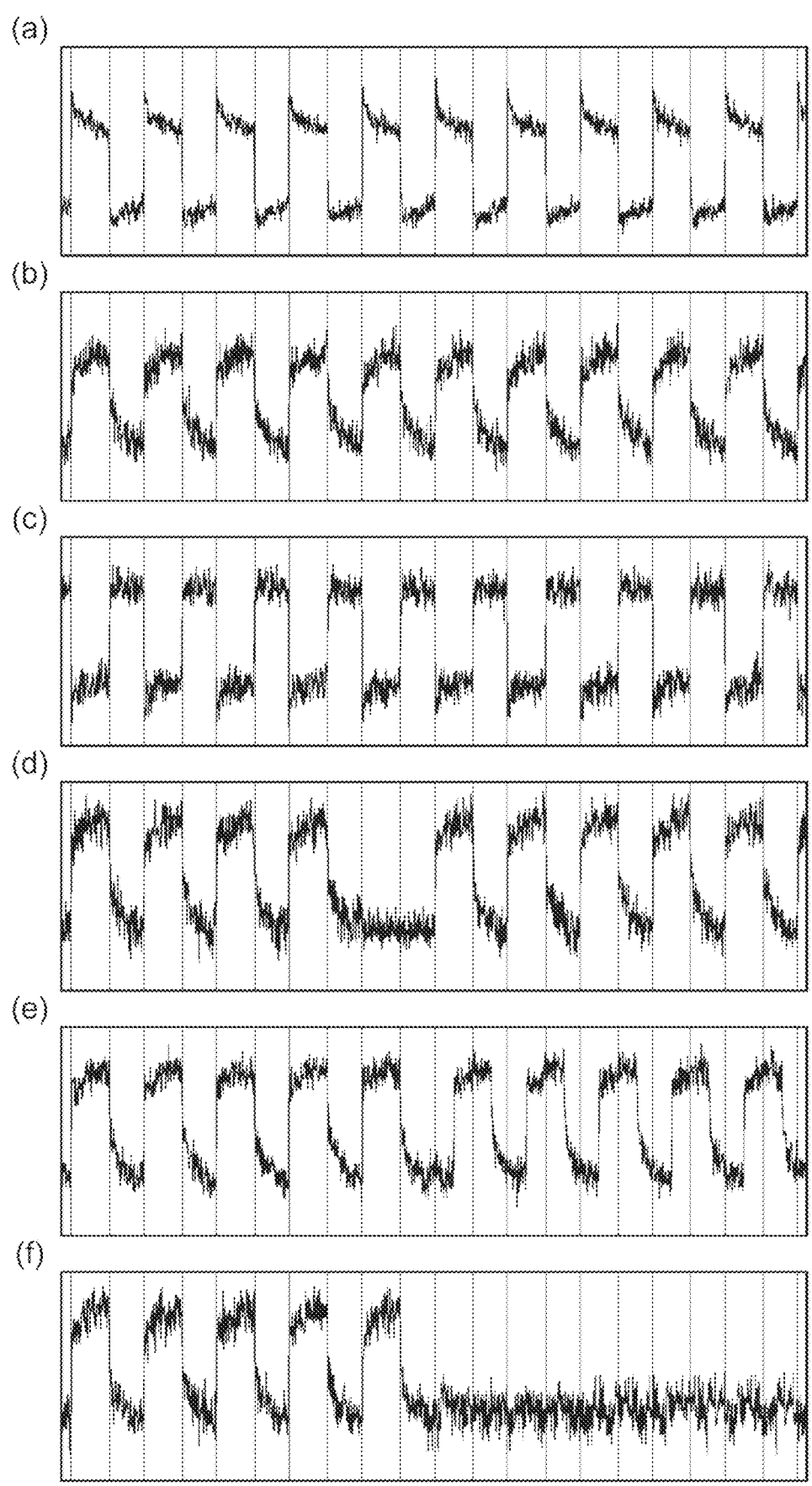
FIG. 27 is a diagram illustrating time waveforms indicated by waveform data items whose degree of correspondence is to be calculated.

The degree of correspondence was calculated using the parameters adjusted as described above. A portion (a) of FIG. 27 illustrates the time waveform of one waveform data item whose degree of correspondence is to be calculated. Portions (b) to (f) of FIG. 27 illustrate the time waveforms of the other waveform data item whose degree of correspondence is to be calculated. That is, the portions (b) to (f) of FIG. 27 illustrate the same waveform, an inverted waveform, a waveform in which one peak has disappeared, a waveform in which delay has occurred in the middle, and a waveform in which a signal has been stopped in the middle, as compared to the waveform of the one waveform data item. The degrees of correspondence S before correction calculated for the waveforms illustrated in the portions (b) to (f) of FIG. 27 are 0.877, 0.971, 0.787, 0.300, and 0.410, respectively. As the degree of waveform deformation increases, the degree of correspondence decreases. Incidentally, here, the inverted waveform is generally estimated to have a low degree of correspondence. However, in EOP analysis, in some cases, the waveform is relatively easily inverted depending on the setting of the focus. Therefore, an absolute value is calculated in the calculation of the degree of correspondence such that a high degree of correspondence is calculated even for the inverted waveform. This is as described above. Since a change in the degree of correspondence S is slower than a change in the waveform, the degree of correspondence S is corrected using the above-mentioned Sigmoid function. As a result, the degrees of correspondence S are 0.836, 0.954, 0.570, 0.001, and 0.005 and the degrees of correspondence S for the waveforms which are clearly changed, that is, the waveform in which one peak has disappeared, the waveform in which delay has occurred in the middle, and the waveform in which a signal has been stopped in the middle are corrected to low degrees of correspondence Sc. It was confirmed that, when the degree of correspondence was converted into a correspondence degree image, it was easy to recognize the degree of correspondence and it was effective in correcting the degree of correspondence.

In the above-described embodiments, as illustrated in FIGS. 23, 24, and 25, the user determines the gain a while viewing the correspondence degree map. However, a method can be applied which determines the gain and the threshold value h only using calculation. For example, it is assumed that the maximum value of the original degree of correspondence is S(max) and the minimum value thereof is S(min). In contrast, it is assumed that a value set to the maximum degree of correspondence after Sigmoid correction is S(high) and a value set to the minimum degree of correspondence is S(low). For example, S(high) is 0.95 and S(low) is 0.05. The threshold value h is represented by Expression (6), which holds for combinations of S(max), S(high), S(min), and S(low). That is, the following Expression (7) is established.

[Equation 8]

$$h = S(\max) + \frac{1}{a}\ln\left(\frac{1}{S(\text{high})} - 1\right) = S(\min) + \frac{1}{a}\ln\left(\frac{1}{S(\text{low})} - 1\right) \quad (7)$$

When calculated from the above-described Expression (7), the gain a is represented by the following Expression (8).

[Equation 9]

$$a = \frac{\ln\left(\frac{1}{S(\text{low})} - 1\right) - \ln\left(\frac{1}{S(\text{high})} - 1\right)}{S(\max) - S(\min)} \quad (8)$$

Here, assuming that S(high)=1−S(low) is established, that is, the set minimum and maximum degrees of correspondence deviate from 0 and 1 by the same value, the above-described Expression (8) is converted into the following Expression (9).

[Equation 10]

$$a = 2\frac{\ln(S(\text{high})) - \ln(S(\text{low}))}{S(\text{max}) - S(\text{min})} \quad (9)$$

The maximum degree of correspondence and the minimum degree of correspondence are set in this way to determine the gain a and the threshold value h. According to this method, when it is determined how wide the range of the degree of correspondence is set first, Sigmoid correction can be automatically calculated. Therefore, this method is effective.

Figure 28:
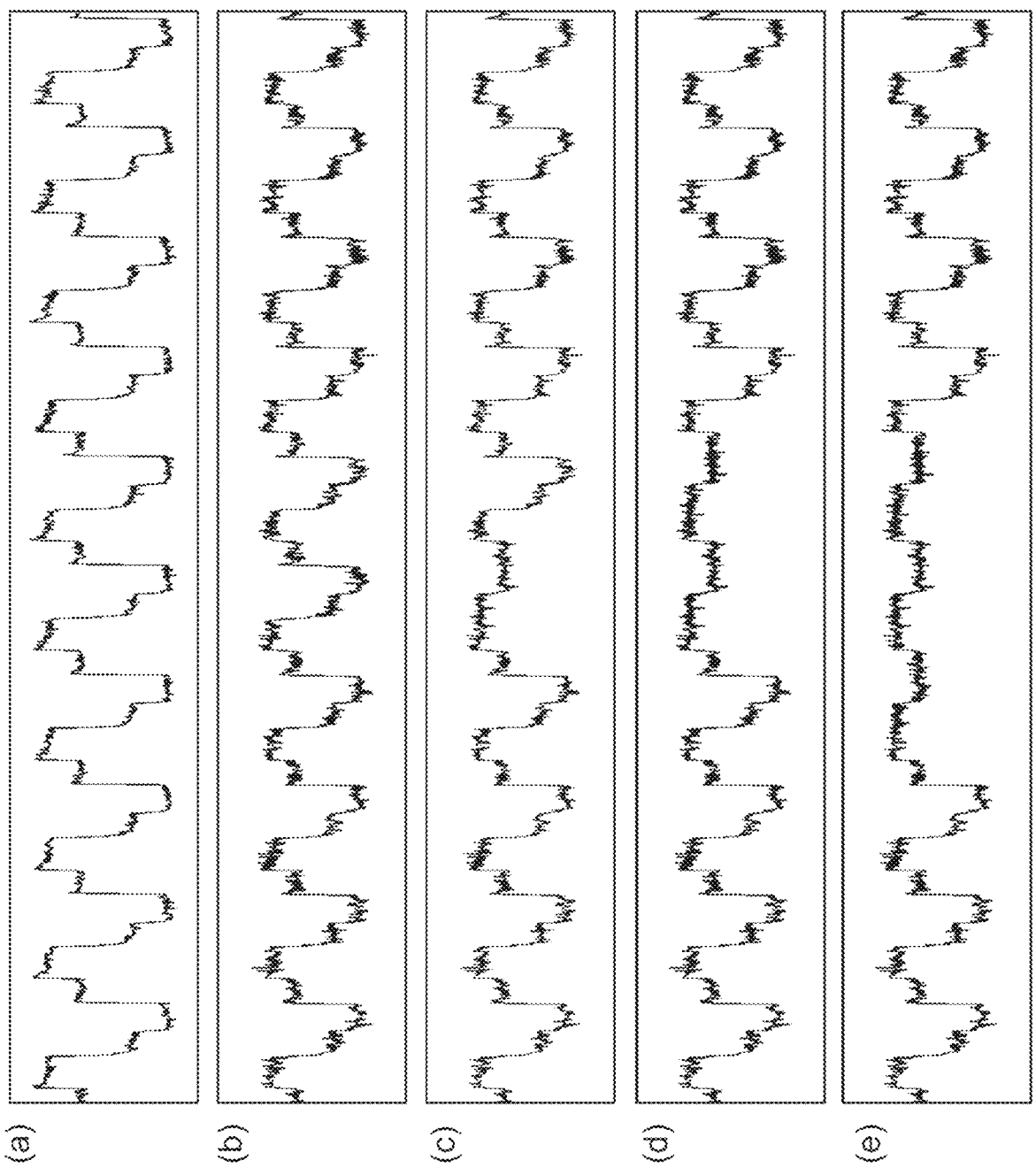
FIG. 28 is a diagram illustrating time waveforms indicated by waveform data items whose degree of correspondence is to be calculated.

Next, other effects of the above-mentioned method for calculating the degree of correspondence will be described. In recent years, transistor dimensions have been reduced with the progress of the device rules. In contrast, the diameter of the focused spot of the laser used for EOP analysis has been reduced with the progress of the application of a specially shaped lens called a solid immersion lens. However, there are physical limitations in reducing the diameter and it is difficult to completely following the reduction in the dimensions of the device. In this case, a laser spot includes a plurality of transistors and EOP waveform signals interfere with each other. In this case, in a method which sets a threshold value of a signal and calculates the degree of correspondence using the timing of a signal traversing the threshold value, the reliability of the calculation of the degree of correspondence for the signals which interfere with each other is reduced. In contrast, in the above-mentioned method which calculates the degree of correspondence using correlation calculation, even in a case in which there is a waveforms having interference, the calculation of the degree of correspondence is not affected by the interference as long as the waveform data is acquired from the same position in a non-defective product and a defective product. For example, when the degrees of correspondence S between the waveform of waveform data illustrated in a portion (a) FIG. 28 and the waveforms of waveform data items illustrated in portions (b) to (e) of FIG. 28, that is, the same waveform, a waveform in which one valley has disappeared, a waveform in which two valleys have disappeared, and a waveform in which three valleys have disappeared, as compared to the waveform of the waveform data illustrated in the portion (a) of FIG. 28, are calculated, the calculated degrees of correspondence are 0.969, 0.898, 0.827, and 0.755. In addition, when the degrees of correspondence are corrected using the Sigmoid function, the corrected degrees of correspondence Sc are 0.950, 0.526, 0.061, and 0.004, which makes it possible to clearly recognize a change in the degree of correspondence. Therefore, this calculation method is also effective for the waveforms that interfere with each other.

Figure 29:
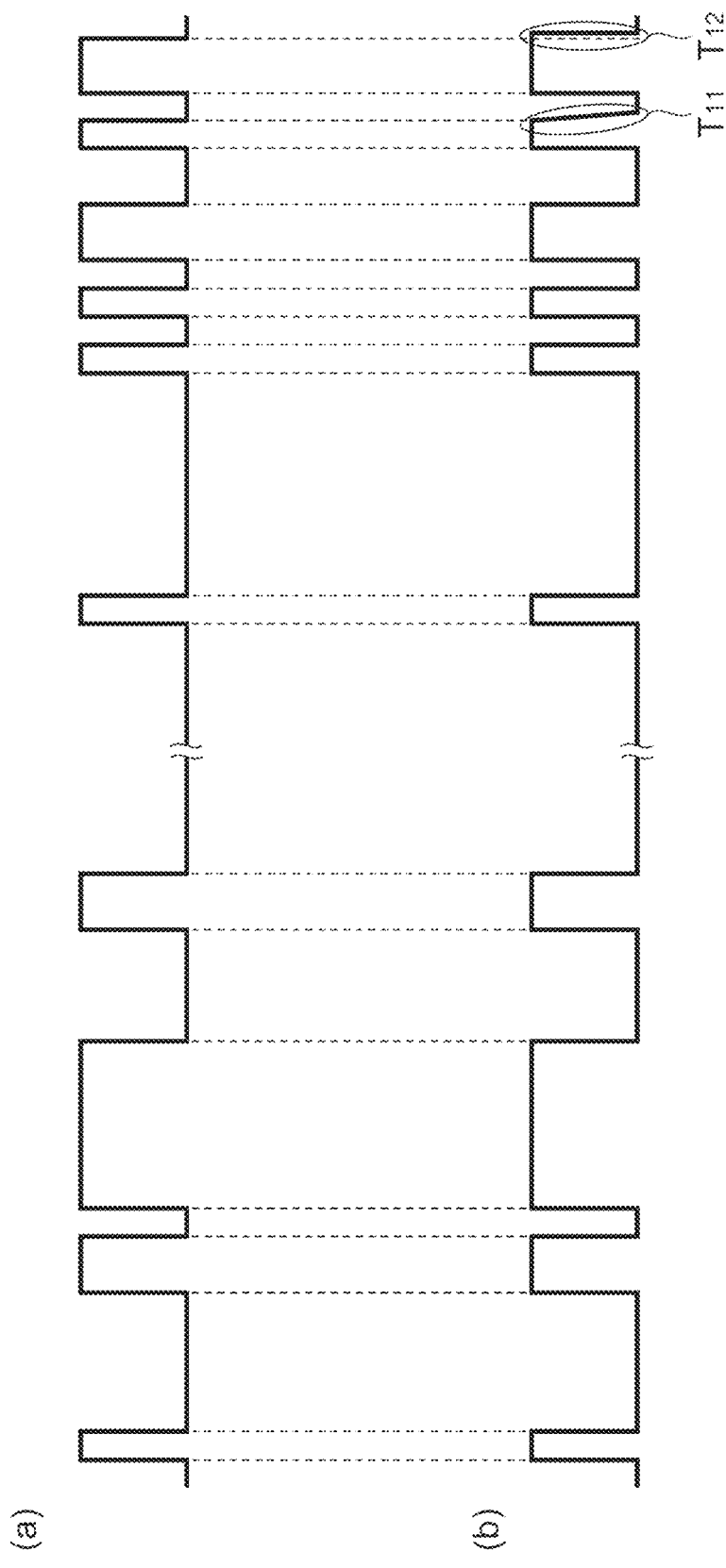
FIG. 29 is a diagram illustrating time waveforms indicated by waveform data items whose degree of correspondence is to be calculated.

The above-method method of calculating the degree of correspondence is an effective method and can be applied to a case in which a change in the waveform is relatively large over the entire time domain. In contrast, in the actual waveform data, the same waveform continues in most of the time slots and a difference in waveform may occur at data points of the time-series data in the limited range between a defective product and a non-defective product. This occurs in a defect that is generally called a function defect and a change in waveform between a non-defective product and a defective product is observed only at the end of a long test pattern. For example, between the waveform data items of a non-defective product and a defective product as illustrated in a portion (a) and a portion (b) of FIG. 29, the dullness of a falling edge occurs in the waveform of the defective product at a timing $T_{11}$ at the end of the waveform and delay occurs in the waveform at a timing $T_{12}$ at the end of the waveform. It is preferable to perform a correspondence degree calculation method that can respond to this situation. Therefore, it is preferable that the above-mentioned correspondence degree calculation method is changed to the following method.

That is, in the correspondence degree calculation method, the same calculation formula as described above is used and the degree of correspondence is not calculated using all of the values of two waveform data items, but is calculated using some values extracted from the values of two waveform data items. Specifically, the degree of correspondence SS(m) is calculated using the following Expression (10) (the value SS is called a degree of movement correspondence):

[Equation 11]

$$SS(m) = \left| \frac{\sum_{k=i}^{j}\{x(k) - \overline{x_{ij}}\}\{y(k) - \overline{y_{ij}}\}}{\sqrt{\sum_{k=i}^{j}\{x(k) - \overline{x_{ij}}\}^2}\sqrt{\sum_{k=i}^{j}\{y(k) - \overline{y_{ij}}\}^2}} \right| \quad (10)$$

The degree of movement correspondence SS(m) is a value obtained by calculating the degree of correspondence from data points of waveform data from k=i to k=j (i and j are natural numbers). The calculation formula for the degree of correspondence is effective as a method that extracts the non-correspondence between the waveforms of data points in a limited time domain which are likely to be buried in the entire waveform. In the above-mentioned Expression (10), the following variables indicate the average values of time-series data items x(k) and y(k) from a data point i to a data point j:

$$\overline{x_{ij}}, \overline{y_{ij}} \quad \text{[Equation 12]}$$

An example of a process using the calculation of the degree of movement correspondence will be described.

First, an example in which the degree of movement correspondence SS is calculated for a waveform including a noise component will be described. A portion (a) of FIG. 30 illustrates a waveform corresponding to the waveform data of a non-defective product, a portion (b) of FIG. 30 illustrates a waveform corresponding to the waveform data of a defective product, a portion (c) of FIG. 30 illustrates a change in the degrees of correspondence SS calculated for these waveform data items, and a portion (d) of FIG. 30 illustrates a waveform obtained by temporally enlarging a part of the waveform illustrated in the portion (c) of FIG. 30. The waveform data is time-series data having a maximum of $2^{19}$ (=524,288) data points which can be acquired by the measurement unit 25 of the control device 18. In this example, it was assumed that the length $T_{CY}$ of the pattern cycle of the waveform of the waveform data was $2^{15}$ (=32,768) and high waveforms and low waveforms of 16 cycles were repeated. In the waveform of the defective product, the falling edge of the last pattern cycle was delayed by a delay time $T_{DE}$ corresponding to 1/16 of the pattern cycle, as compared to the waveform of the non-defective product. When the degree of correspondence S was calculated for the waveform data, the degree of correspondence S was 0.744. The degree of correspondence S was reduced due to the noise component. However, when the corrected value Sc was calculated except the noise component, the degree of correspondence was 0.992 and a reduction in the degree of correspondence was estimated to be small. In contrast, when the degree of movement correspondence SS was calculated, a reduction in the degree of correspondence in the vicinity of the last data point was confirmed. It is estimated that the reduction in the degree of correspondence occurs at two timings when the waveform of the non-defective product and the waveform of the defective product do not correspond to each other. Here, the two timings are the timing when the waveform of the non-defective product falls and the delayed waveform of the defective product is maintained in a high state and the timing when the waveform of the non-defective product is maintained in a low state and the delayed waveform of the defective product falls. The application of the calculation of the degree of movement correspondence SS makes it possible to analyze the waveform of a defective product which changes in the limited range of data points in the waveform.

A portion (a) of FIG. 31 illustrates a waveform corresponding to the waveform data of a non-defective product, a portion (b) of FIG. 31 illustrates a waveform corresponding to the waveform data of a defective product, and a portion (c) of FIG. 31 illustrates a change in the degree of correspondence SS calculated for these waveform data items. In this example, in the waveform of the defective product, the timing is delayed by a delay time $T_{DE}$ corresponding to 1/16 of the pattern cycle at a timing in the vicinity of the center and the timing delay is maintained thereafter, as compared to the waveform of the non-defective product. It can be seen that the degree of movement correspondence SS calculated for these waveform data items is reduced at the time point when timing mismatching occurs first and is reduced at each time point when the timing mismatching occurs thereafter. In this example, it can be confirmed that the timing when the degree of correspondence is reduced first is the generation timing of a defect. Incidentally, in a case in which the degree of correspondence S is calculated for the same waveform data using all of the waveform data items, the value of the degree of correspondence S is calculated as 0.657 and the corrected degree of correspondence Sc except a noise component is calculated as 0.875. As such, a reduction in the degree of correspondence is larger than that in the example illustrated in FIG. 30 in which timing non-correspondence occurs only in one part. However, the reduction in the degree of correspondence is not sufficient and it is difficult to recognize the non-correspondence. In contrast, when the calculation of the degree of movement correspondence is applied, it is possible to relatively easily recognize the non-correspondence between some of the data points and to recognize the timing when the non-correspondence occurs. There are several methods for displaying information obtained by this method on a correspondence degree map. For example, a method is considered which creates a correspondence degree map for a time slot in the vicinity of the timing when a reduction in the degree of correspondence is detected and checks whether or not there is a change in the degree of correspondence for each point in the map.

In the above-mentioned calculation method, the degree of correspondence is calculated without processing the acquired waveform data. However, a certain process may be performed for the waveform data and then the degree of correspondence may be calculated. The certain process is, for example, a process for applying a moving average filter, a median filter, or a wavelet filter. In that case, it is possible to reduce the influence of noise. On the other hand, there is a possibility that a detailed signal operation will be desensitized depending on the selection of a process and it is necessary to select an appropriate process and its parameters. These processes are effective for extracting an appropriate timing in the above-mentioned method that provides a predetermined threshold value for the value of the time waveform and detects the timing when the time waveform traverses the threshold value.

In the above-mentioned embodiment, preferably, the analysis method further includes an image generation step of mapping the degree of correspondence for each of the plurality of positions calculated in the calculation step onto coordinates to generate correspondence degree image data. Preferably, in the analysis step, a defective part of the first or second semiconductor device is analyzed on the basis of the correspondence degree image data. In another aspect described above, preferably, the control device further includes an image generation means for mapping the degree of correspondence for each of the plurality of positions calculated by the calculation means onto coordinates to generate correspondence degree image data. Preferably, the analysis means analyzes a defective part of the first or second semiconductor device on the basis of the correspondence degree image data. In this case, since the defective part is analyzed on the basis of the image data in which the degree of correspondence between the time waveforms is mapped onto the coordinates, it is possible to more effectively analyze the defective part.

In addition, preferably, in the analysis step, positions are tracked from a position where the degree of correspondence is relatively low on the coordinates to a position where the degree of correspondence is relatively high on the coordinates using the correspondence degree image data to analyze the defective part. Preferably, the analysis means tracks positions from a position where the degree of correspondence is relatively low on the coordinates to a position where the degree of correspondence is relatively high on the coordinates using the correspondence degree image data to analyze the defective part. In this case, it is possible to analyze a part causing a defect using position tracking and to more effectively specify a defective part.

Further, preferably, in the analysis step, a circuit diagram is created on the basis of mask data related to one of the first semiconductor device and the second semiconductor device and a position tracking route is determined on the basis of the circuit diagram. Preferably, the analysis means creates a circuit diagram on the basis of mask data related to one of the first semiconductor device and the second semiconductor device and determines a position tracking route on the basis of the circuit diagram. In this case, it is possible to perform position tracking on the basis of the circuit diagram while considering a signal transmission direction between the circuit blocks and to reliably specify a defective part.

Furthermore, preferably, in the calculation step, a degree of correspondence between changes in amplitudes of the time waveforms in the first waveform data and the second waveform data is calculated. Preferably, the calculation means calculates a degree of correspondence between changes in amplitudes of the time waveforms in the first waveform data and the second waveform data. In this case, it is possible to appropriately specify a defective part of a semiconductor device using the degree of correspondence between changes in amplitudes.

In addition, preferably, in the calculation step, the degree of correspondence is calculated on the basis of rising and falling timings in the first waveform data and the second waveform data. Preferably, the calculation means calculates the degree of correspondence on the basis of rising and falling timings in the first waveform data and the second waveform data. This configuration makes it possible to easily specify a defective part of a semiconductor device.

Further, preferably, in the calculation step, a result of comparison with a threshold value in the first waveform data and the second waveform data is calculated at a plurality of timings and the degree of correspondence is calculated on the basis of the comparison results at the plurality of timings. Preferably, the calculation means calculates a result of comparison with a threshold value in the first waveform data and the second waveform data at a plurality of timings and calculates the degree of correspondence on the basis of the comparison results at the plurality of timings. This configuration makes it possible to easily specify a defective part of a semiconductor device.

Furthermore, preferably, in the first measurement step and the second measurement step, light is emitted to a plurality of positions of the first semiconductor device or the second semiconductor device to which a test signal has been input and reflected light from the plurality of positions is measured to acquire the first waveform data or the second waveform data. In another aspect described above, preferably, the analysis apparatus further includes: a light source configured to emit light; and an optical scanning unit configured to scan the semiconductor device with the light emitted from the light source. Preferably, the acquisition means of the control device controls the optical scanning unit such that light is emitted to a plurality of positions of the first semiconductor device and the second semiconductor device and measures reflected light from the plurality of positions of the first semiconductor device and the second semiconductor device to acquire the first waveform data and the second waveform data. According to this configuration, it is possible to easily analyze a defective part of a semiconductor device by measuring reflected light generated by the emission of light to a plurality of positions of the semiconductor device.

In addition, preferably, in the first measurement step and the second measurement step, light emission from a plurality of positions of the first semiconductor device or the second semiconductor device to which a test signal has been input is measured to acquire the first waveform data or the second waveform data. Preferably, the acquisition means measures light emission from the plurality of positions of the first semiconductor device and the second semiconductor device to acquire the first waveform data and the second waveform data. According to this configuration, it is possible to easily analyze a defective part of a semiconductor device by measuring light emission from a plurality of positions of the semiconductor device.

INDUSTRIAL APPLICABILITY

The embodiments are used for an analysis method, an analysis apparatus, an analysis program, and a recording medium having the analysis program recorded thereon which perform an analysis process using optical measurement for a semiconductor device and can effectively analyze a defective part of the semiconductor device.

REFERENCE SIGNS LIST

1: semiconductor device inspection apparatus, 2: light source, 7: scanning optical system (optical scanning unit), 8: scanning head, 9: lens system, 10: semiconductor device, 11: optical fiber (optical system), 12: light sensor (light detector), 18: control device, 23: data reading unit, 24: setting unit, 25: measurement unit (acquisition means), 26: calculation unit (calculation means), 27: image generation unit (image generation means), 28: analysis unit (analysis means), $G_{COM}$: correspondence degree image data.

The invention claimed is:

1. An analysis method for performing an analysis process using optical measurement for a semiconductor device, the method comprising:
    acquiring first waveform data which is a time waveform obtained by optical measurement for each of a plurality of positions on a first semiconductor device;
    acquiring second waveform data which is a time waveform obtained by the optical measurement for each of a plurality of positions on a second semiconductor device;
    calculating a degree of correspondence between the first waveform data for each of the plurality of positions of the first semiconductor device and the second waveform data for each of the plurality of positions of the second semiconductor device which correspond to the plurality of positions;
    mapping the calculated degree of correspondence for each of the plurality of positions onto coordinates to generate correspondence degree image data; and
    analyzing a defective part of the first or second semiconductor device on the basis of the calculated degree of correspondence for each of the plurality of positions and the correspondence degree image data, wherein, in the analyzing, positions are tracked along a signal transmission direction on the first semiconductor device or the second semiconductor device from a position where the degree of correspondence is relatively low on the coordinates to a position where the degree of correspondence is relatively high on the coordinates using the correspondence degree image data to analyze the defective part.

2. The analysis method according to claim 1,
    wherein, in the analyzing, a circuit diagram is created on the basis of mask data related to one of the first semiconductor device and the second semiconductor device and a position tracking route is determined on the basis of the circuit diagram.

3. The analysis method according to claim 1,
    wherein, in the calculating, a degree of correspondence between changes in amplitudes of the time waveforms in the first waveform data and the second waveform data is calculated.

4. The analysis method according to claim 3,
    wherein, in the calculating, the degree of correspondence is calculated on the basis of rising and falling timings in the first waveform data and the second waveform data.

5. The analysis method according to claim 3,
    wherein, in the calculating, a result of comparison with a threshold value in the first waveform data and the second waveform data is calculated at a plurality of timings and the degree of correspondence is calculated on the basis of the comparison results at the plurality of timings.

6. The analysis method according to claim 1, wherein light is emitted to a plurality of positions of the first semiconductor device or the second semiconductor device to which a test signal has been input and reflected light from the plurality of positions is measured to acquire the first waveform data or the second waveform data.

7. The analysis method according to claim 1, wherein light emission from a plurality of positions of the first semiconductor device or the second semiconductor device to which a test signal has been input is measured to acquire the first waveform data or the second waveform data.

8. An analysis apparatus that performs an analysis process using optical measurement for a semiconductor device, the apparatus comprising:
a light detector configured to detect light from the semiconductor device to which a test signal has been input;
an optical system for guiding light from the semiconductor device to the light detector; and
a control device being electrically connected to the light detector,
wherein the control device is configured to:
acquire first waveform data which is a time waveform obtained by the optical measurement for each of a plurality of positions on a first semiconductor device and second waveform data which is a time waveform obtained by the optical measurement for each of a plurality of positions on a second semiconductor device;
calculate a degree of correspondence between the first waveform data for each of the plurality of positions of the first semiconductor device and the second waveform data for each of the plurality of positions of the second semiconductor device which correspond to the plurality of positions;
map the calculated degree of correspondence for each of the plurality of positions onto coordinates to generate correspondence degree image data; and
analyze a defective part of the first or second semiconductor device on the basis of the calculated degree of correspondence for each of the plurality of positions and the correspondence degree image data, wherein the control device tracks positions along a signal transmission direction on the first semiconductor device or the second semiconductor device from a position where the degree of correspondence is relatively low on the coordinates to a position where the degree of correspondence is relatively high on the coordinates using the correspondence degree image data to analyze the defective part.

9. The analysis apparatus according to claim 8, wherein the control device creates a circuit diagram on the basis of mask data related to one of the first semiconductor device and the second semiconductor device and determines a position tracking route on the basis of the circuit diagram.

10. The analysis apparatus according to claim 8, wherein the control device calculates a degree of correspondence between changes in amplitudes of the time waveforms in the first waveform data and the second waveform data.

11. The analysis apparatus according to claim 10, wherein the control device calculates the degree of correspondence on the basis of rising and falling timings in the first waveform data and the second waveform data.

12. The analysis apparatus according to claim 10, wherein the control device calculates a result of comparison with a threshold value in the first waveform data and the second waveform data at a plurality of timings and calculates the degree of correspondence on the basis of the comparison results at the plurality of timings.

13. The analysis apparatus according to claim 8, further comprising:
a light source configured to emit light; and
an optical scanning unit configured to scan the semiconductor device with the light emitted from the light source,
wherein the control device controls the optical scanning unit such that light is emitted to a plurality of positions of the first semiconductor device and the second semiconductor device and measures reflected light from the plurality of positions of the first semiconductor device and the second semiconductor device to acquire the first waveform data and the second waveform data.

14. The analysis apparatus according to claim 8, wherein the control device measures light emission from the plurality of positions of the first semiconductor device and the second semiconductor device to acquire the first waveform data and the second waveform data.

15. A non-transitory computer-readable recording medium that stores an analysis program that causes a computer to function as steps of:
acquiring first waveform data which is a time waveform obtained by optical measurement for each of a plurality of positions on a first semiconductor device and second waveform data which is a time waveform obtained by the optical measurement for each of a plurality of positions on a second semiconductor device;
calculating a degree of correspondence between the first waveform data for each of the plurality of positions of the first semiconductor device and the second waveform data for each of the plurality of positions of the second semiconductor device which correspond to the plurality of positions;
mapping the calculated degree of correspondence for each of the plurality of positions onto coordinates to generate correspondence degree image data; and
analyzing a defective part of the first or second semiconductor device on the basis of the calculated degree of correspondence for each of the plurality of positions and the correspondence degree image data, wherein, in the analyzing, positions are tracked along a signal transmission direction on the first semiconductor device or the second semiconductor device from a position where the degree of correspondence is relatively low on the coordinates to a position where the degree of correspondence is relatively high on the coordinates using the correspondence degree image data to analyze the defective part.

* * * * *